(12) United States Patent
Arena et al.

(10) Patent No.: US 9,076,666 B2
(45) Date of Patent: Jul. 7, 2015

(54) TEMPLATE LAYERS FOR HETEROEPITAXIAL DEPOSITION OF III-NITRIDE SEMICONDUCTOR MATERIALS USING HVPE PROCESSES

(75) Inventors: Chantal Arena, Mesa, AZ (US); Ronald Thomas Bertram, Jr., Mesa, AZ (US); Ed Lindow, Cornville, AZ (US); Subhash Mahajan, El Macero, CA (US); Ilsu Han, Tempe, AZ (US)

(73) Assignees: SOITEC, Bernin (FR); Arizona Board of Regents For and On Behalf Arizona State University, Scottsdale, AZ (US)

( * ) Notice: Subject to any disclaimer, the term of this patent is extended or adjusted under 35 U.S.C. 154(b) by 0 days.

(21) Appl. No.: 13/989,004

(22) PCT Filed: Nov. 23, 2011
(Under 37 CFR 1.47)

(86) PCT No.: PCT/EP2011/070772
§ 371 (c)(1),
(2), (4) Date: Nov. 11, 2013

(87) PCT Pub. No.: WO2012/069521
PCT Pub. Date: May 31, 2012

(65) Prior Publication Data
US 2014/0217553 A1    Aug. 7, 2014

Related U.S. Application Data

(60) Provisional application No. 61/416,542, filed on Nov. 23, 2010.

(30) Foreign Application Priority Data

Dec. 8, 2010 (FR) ...................... 10 60264

(51) Int. Cl.
*H01L 21/00* (2006.01)
*H01L 29/06* (2006.01)
(Continued)

(52) U.S. Cl.
CPC .......... *H01L 29/0665* (2013.01); *C30B 25/183* (2013.01); *C30B 29/403* (2013.01);
(Continued)

(58) Field of Classification Search
CPC ............ C30B 29/403; H01L 21/02458; H01L 21/02513; H01L 21/0254; H01L 21/02667; H01L 29/0665
See application file for complete search history.

(56) References Cited

U.S. PATENT DOCUMENTS 5,232,508 A    8/1993    Arena et al.
5,635,093 A    6/1997    Arena et al.
(Continued)

FOREIGN PATENT DOCUMENTS

CN    100509821 C    7/2009
JP    2002-093720 A    3/2002
(Continued)

OTHER PUBLICATIONS

Arena et al., Gas Injectors for CVD Systems with the Same, U.S. Appl. No. 61/157,112, filed Mar. 3, 2009.
(Continued)

*Primary Examiner* — Ngan Ngo
(74) *Attorney, Agent, or Firm* — TraskBritt

(57) ABSTRACT

Methods of depositing III-nitride semiconductor materials on substrates include depositing a layer of III-nitride semi-conductor material on a surface of a substrate in a nucleation HVPE process stage to form a nucleation layer having a microstructure comprising at least some amorphous III-nitride semiconductor material. The nucleation layer may be annealed to form crystalline islands of epitaxial nucleation material on the surface of the substrate. The islands of epitaxial nucleation material may be grown and coalesced in a coalescence HVPE process stage to form a nucleation template layer of the epitaxial nucleation material. The nucleation template layer may at least substantially cover the surface of the substrate. Additional III-nitride semiconductor material may be deposited over the nucleation template layer of the epitaxial nucleation material in an additional HVPE process stage. Final and intermediate structures comprising III-nitride semiconductor material are formed by such methods.

18 Claims, 10 Drawing Sheets

(51) Int. Cl.
    *C30B 25/18* (2006.01)
    *C30B 29/40* (2006.01)
    *H01L 21/02* (2006.01)
(52) U.S. Cl.
    CPC ...... *H01L21/0242* (2013.01); *H01L 21/02458* (2013.01); *H01L 21/02513* (2013.01); *H01L 21/0254* (2013.01); *H01L 21/0262* (2013.01); *H01L 21/02667* (2013.01)

(56) References Cited

U.S. PATENT DOCUMENTS

| | | |
|---|---|---|
| 5,972,790 A | 10/1999 | Arena et al. |
| 6,090,705 A | 7/2000 | Arena et al. |
| 6,121,140 A | 9/2000 | Arena et al. |
| 6,179,913 B1 | 1/2001 | Solomon et al. |
| 7,118,929 B2 | 10/2006 | Frayssinet et al. |
| 7,390,360 B2 | 6/2008 | Shenai-Khatkhate et al. |
| 7,427,556 B2 | 9/2008 | Tomasini et al. |
| 7,452,757 B2 | 11/2008 | Werkhoven et al. |
| 7,514,372 B2 | 4/2009 | Arena et al. |
| 7,666,799 B2 | 2/2010 | Arena et al. |
| 7,732,306 B2 | 6/2010 | Arena et al. |
| 7,785,995 B2 | 8/2010 | Cody et al. |
| 7,816,236 B2 | 10/2010 | Bauer et al. |
| 7,902,045 B2 | 3/2011 | Arena et al. |
| 8,154,022 B2 | 4/2012 | Arena et al. |
| 8,178,427 B2 | 5/2012 | Arena et al. |
| 8,197,597 B2 | 6/2012 | Arena et al. |
| 8,236,593 B2 | 8/2012 | Arena et al. |
| 8,247,314 B2 | 8/2012 | Arena |
| 8,278,193 B2 | 10/2012 | Arena |
| 8,318,612 B2 | 11/2012 | Arena et al. |
| 8,323,407 B2 | 12/2012 | Arena et al. |
| 8,329,565 B2 | 12/2012 | Arena et al. |
| 8,367,520 B2 | 2/2013 | Arena |
| 8,377,802 B2 | 2/2013 | Lindow et al. |
| 8,382,898 B2 | 2/2013 | Arena et al. |
| 8,388,755 B2 | 3/2013 | Arena et al. |
| 8,431,419 B2 | 4/2013 | Bertram, Jr. et al. |
| 8,643,024 B2 * | 2/2014 | Chakraborty et al. .......... 257/76 |
| 2004/0097022 A1 | 5/2004 | Werkhoven et al. |
| 2004/0137732 A1 | 7/2004 | Frayssinet et al. |
| 2004/0259333 A1 | 12/2004 | Tomasini et al. |
| 2005/0051795 A1 | 3/2005 | Arena et al. |
| 2006/0234504 A1 | 10/2006 | Bauer et al. |
| 2007/0264801 A1 | 11/2007 | Cody et al. |
| 2008/0026149 A1 | 1/2008 | Tomasini et al. |
| 2008/0303118 A1 | 12/2008 | Arena et al. |
| 2009/0081110 A1 | 3/2009 | Shibata et al. |
| 2009/0091002 A1 | 4/2009 | Arena et al. |
| 2009/0098343 A1 | 4/2009 | Arena et al. |
| 2009/0178611 A1 | 7/2009 | Arena et al. |
| 2009/0189185 A1 | 7/2009 | Arena et al. |
| 2009/0205563 A1 | 8/2009 | Arena et al. |
| 2009/0214785 A1 | 8/2009 | Arena et al. |
| 2009/0223441 A1 | 9/2009 | Arena et al. |
| 2009/0223442 A1 | 9/2009 | Arena et al. |
| 2009/0223453 A1 | 9/2009 | Arena et al. |
| 2009/0278136 A1 | 11/2009 | Beaumont et al. |
| 2009/0283029 A1 | 11/2009 | Arena et al. |
| 2010/0072576 A1 | 3/2010 | Arena |
| 2010/0109126 A1 | 5/2010 | Arena |
| 2010/0124814 A1 | 5/2010 | Arena |
| 2010/0133548 A1 | 6/2010 | Arena et al. |
| 2010/0180913 A1 | 7/2010 | Arena et al. |
| 2010/0187568 A1 | 7/2010 | Arena |
| 2010/0242835 A1 | 9/2010 | Arena et al. |
| 2010/0244197 A1 | 9/2010 | Arena et al. |
| 2010/0244203 A1 | 9/2010 | Arena |
| 2010/0258053 A1 | 10/2010 | Arena et al. |
| 2011/0011450 A1 | 1/2011 | Arena |
| 2011/0024747 A1 | 2/2011 | Arena et al. |
| 2011/0037075 A1 | 2/2011 | Arena et al. |
| 2011/0057294 A1 | 3/2011 | Arena |
| 2011/0101373 A1 | 5/2011 | Arena et al. |
| 2011/0156212 A1 | 6/2011 | Arena |
| 2011/0212546 A1 | 9/2011 | Bertram, Jr. et al. |
| 2011/0212603 A1 | 9/2011 | Arena et al. |
| 2011/0277681 A1 | 11/2011 | Arena et al. |
| 2011/0284863 A1 | 11/2011 | Lindow et al. |
| 2011/0305835 A1 | 12/2011 | Bertram, Jr. et al. |
| 2012/0048182 A1 | 3/2012 | Arena et al. |
| 2012/0083100 A1 | 4/2012 | Bertram, Jr. |
| 2012/0085400 A1 | 4/2012 | Arena et al. |
| 2012/0091467 A1 * | 4/2012 | Chakraborty et al. .......... 257/76 |
| 2012/0119218 A1 * | 5/2012 | Su .................. 257/76 |
| 2012/0132922 A1 | 5/2012 | Arena et al. |
| 2012/0187541 A1 | 7/2012 | Arena et al. |
| 2012/0199845 A1 | 8/2012 | Werkhoven et al. |
| 2012/0211870 A1 | 8/2012 | Figuet et al. |
| 2012/0280249 A1 | 11/2012 | Arena |
| 2012/0319128 A1 | 12/2012 | Arena |
| 2013/0052333 A1 | 2/2013 | Lindow et al. |
| 2013/0052806 A1 | 2/2013 | Bertram, Jr. et al. |

FOREIGN PATENT DOCUMENTS

| | | |
|---|---|---|
| JP | 2005-019872 A | 1/2005 |
| WO | 2009015337 A1 | 1/2009 |
| WO | 2010101715 A1 | 9/2010 |

OTHER PUBLICATIONS

French Search Report and Opinion for French Application No. 1060264 dated Jun. 28, 2011, 10 pages.
International Search Report for International Application No. PCT/EP2011/070772 dated Mar. 12, 2012, 4 pages.
International Written Opinion for International Application No. PCT/EP2011/070772 dated Mar. 12, 2012, 8 pages.
Lee et al., Vapor Phase Epitaxy of GaN Using GaCl3/N2 and NH3/N2, Journal of Crystal Growth, vol. 169 (1996), pp. 689-696.
Meng et al., Direct Observation of Formation of Threading Dislocations from Stacking Faults in GaN Layer Grown on (0 0 0 1) Sapphire, Scripta Materialia, vol. 64 (2011), pp. 93-96.
Taiwan Office Action and Search Report for Taiwan Application No. 100134222, dated Jan. 27, 2014, 12 pages.
International Preliminary Report on Patentability for International Application No. PCT/EP2011/070772 dated May 28, 2013, 7 pages.
Bohnen et al., "The nucleation of HCl and Cl 2-based HVPE GaN on mis-oriented sapphire substrates", Phys. Status Solidi. C, vol. 7, pp. 1749-1755, May 18, 2010, 7 pages.
Japanese Office Action for Japanese Application No. 2013-540342 dated Mar. 24, 2015, 4 pages.
Chinese Office Action and Search Report for Chinese Application No. 201180056302.5 dated May 5, 2015, 8 pages.

* cited by examiner

TEMPLATE LAYERS FOR HETEROEPITAXIAL DEPOSITION OF III-NITRIDE SEMICONDUCTOR MATERIALS USING HVPE PROCESSES

CROSS-REFERENCE TO RELATED APPLICATIONS

This application is a national phase entry under 35 U.S.C. §371 of International Patent Application PCT/EP2011/070772, filed Nov. 23, 2011, designating the United States of America and published in English as International Patent Publication WO 2012/069521 A1 on May 31, 2012, which claims the benefit under Article 8 of the Patent Cooperation Treaty and under 35 U.S.C. §119(e) to United States Provisional Patent Application Serial No. 61/416,542, filed Nov. 23, 2010, and to French Patent Application Serial No. 1060264, filed Dec. 8, 2010, the disclosure of each of which is hereby incorporated herein by this reference in its entirety.

FIELD

Embodiments of the invention generally relate to methods for depositing III-nitride materials on substrates, and structures formed by such methods. More particularly, embodiments of the invention relate to methods for depositing III-nitride materials on substrates that include a growth template layer comprising a metal-nitride material, and structures formed by such methods.

BACKGROUND

Chemical vapor deposition (CVD) is a chemical process that is used to deposit solid materials on substrates, and is commonly employed in the manufacture of semiconductor devices. In chemical vapor deposition processes, a substrate is exposed to one or more reagent gases, which react, decompose, or both react and decompose in a manner that results in the deposition of a solid material on the surface of the substrate.

One particular type of CVD process is referred to in the art as vapor phase epitaxy (VPE). In VPE processes, a substrate is exposed to one or more reagent vapors in a reaction chamber, which react, decompose, or both react and decompose in a manner that results in the epitaxial deposition of a solid material on the surface of the substrate. VPE processes are often used to deposit III-V semiconductor materials. When one of the reagent vapors in a VPE process comprises a halide vapor, the process may be referred to as a halide vapor phase epitaxy (HVPE) process.

It is known in the art to form III-nitride semiconductor materials, such as gallium nitride (GaN), using VPE processes in which metallorganic (MO) precursor materials are decomposed within a reaction chamber to form the III-nitride semiconductor material. Such processes are often referred to as metallorganic vapor phase epitaxy (MOVPE) processes, and may also be characterized as metallorganic chemical vapor deposition (MOCVD) processes. Such MOVPE processes are commonly performed utilizing several sequential pre-deposition processes prior to the deposition of the desired bulk III-nitride semiconductor material. These sequential pre-deposition processes may include a high temperature hydrogen bake of the growth substrate (e.g., a sapphire substrate), nitridation of the growth substrate, formation of a nucleation template layer of a III-nitride material at relatively low temperatures on the growth substrate, annealing of the nucleation template layer at relatively higher temperatures, coalescence of the nucleation template layer, and finally growth of the bulk III-nitride material layer on the nucleation template layer.

HVPE processes are also used to form III-nitride semiconductor materials such as gallium nitride (GaN). In such processes, epitaxial growth of GaN on a substrate may result from a vapor phase reaction between gallium chloride (GaCl) and ammonia ($NH_3$) that is carried out within a reaction chamber at elevated temperatures between about 500° C. and about 1,000° C. The $NH_3$ may be supplied from a standard source of $NH_3$ gas. In some methods, the GaCl vapor is provided by passing hydrogen chloride (HCl) gas (which may be supplied from a standard source of HCl gas) over heated liquid gallium (Ga) to form GaCl in situ within the reaction chamber. The liquid gallium may be heated to a temperature of between about 750° C. and about 850° C. The GaCl and the $NH_3$ may be directed to (e.g., over) a surface of a heated substrate, such as a wafer of semiconductor material. U.S. Pat. No. 6,179,913, which issued Jan. 30, 2001 to Solomon et al., discloses a gas injection system for use in such systems and methods.

HVPE processes are currently widely used to grow relatively thick GaN layers on sapphire, mainly due to the relatively fast growth rates that can be attained through HVPE processes, which growth rates range from tens to hundreds of microns per hour. The growth of thick GaN layers using HVPE, however, usually requires GaN template layers grown by metal-organic chemical vapor deposition (MOCVD). Without such GaN template layers, GaN layers grown directly on sapphire usually crack when thickness exceeds certain values.

BRIEF SUMMARY

This summary is provided to introduce a selection of concepts in a simplified form that, which concepts are further described in the detailed description below of some example embodiments of the invention. This summary is not intended to identify key features or essential features of the claimed subject matter, nor is it intended to be used to limit the scope of the claimed subject matter.

It would be desirable to provide methods and systems that may be used to form relatively thick layers of III-V semiconductor materials, such as III-nitride semiconductor material (e.g., GaN), directly on non-native substrates, such as sapphire, using HVPE processes.

In some embodiments, the present invention includes methods of depositing III-nitride semiconductor materials on substrates. Such methods may involve the use of at least one of a metal trichloride precursor and a metal tetrachloride precursor. In accordance with such methods, a layer of III-nitride semiconductor material is deposited on a surface of a substrate in a nucleation HVPE process stage to form a nucleation layer having a nanostructure comprising at least some wurtzite crystallites and some amorphous III-nitride semiconductor material. The nucleation layer is annealed to form crystalline islands of at least substantially wurtzite nucleation material on the surface of the substrate. The islands of at least substantially wurtzite nucleation material are grown and coalesced in a coalescence HVPE process stage to form a nucleation template layer of the at least substantially wurtzite nucleation material. The nucleation template layer may at least substantially cover the surface of the substrate. Additional III-nitride semiconductor material is deposited over the nucleation template layer of the at least substantially wurtzite nucleation material in an additional HVPE process stage.

Additional embodiments of the invention include final and intermediate structures comprising III-nitride semiconductor material that are formed by methods as disclosed herein.

BRIEF DESCRIPTION OF THE DRAWINGS

Embodiments of the present invention may be understood more fully by reference to the following detailed description of example embodiments, which are illustrated in the appended figures in which:

FIG. 11 is a simplified illustration of how a microstructure of the nucleation layer of FIG. 6 may appear prior to annealing the nucleation layer to form the islands of nucleation material shown in FIG. 7, and illustrates amorphous and crystalline regions in the microstructure of the nucleation layer;

FIG. 12 illustrates a decomposition and redeposition mechanism by which amorphous material in the nucleation layer of FIG. 6 may be incorporated into the crystal structure of crystalline regions in the nucleation layer during formation of the crystalline islands of nucleation material shown in FIG. 7;

FIG. 13 illustrates islands of nucleation material similar to those of FIG. 7 but having different shapes, including flat-topped or "mesa-shaped" islands and sharp, "peak-shaped" islands, which may be formed upon annealing the nucleation layer shown in FIG. 6 to form the islands of nucleation material shown in FIG. 7;

DETAILED DESCRIPTION OF EMBODIMENTS OF THE INVENTION

Figure 1A:
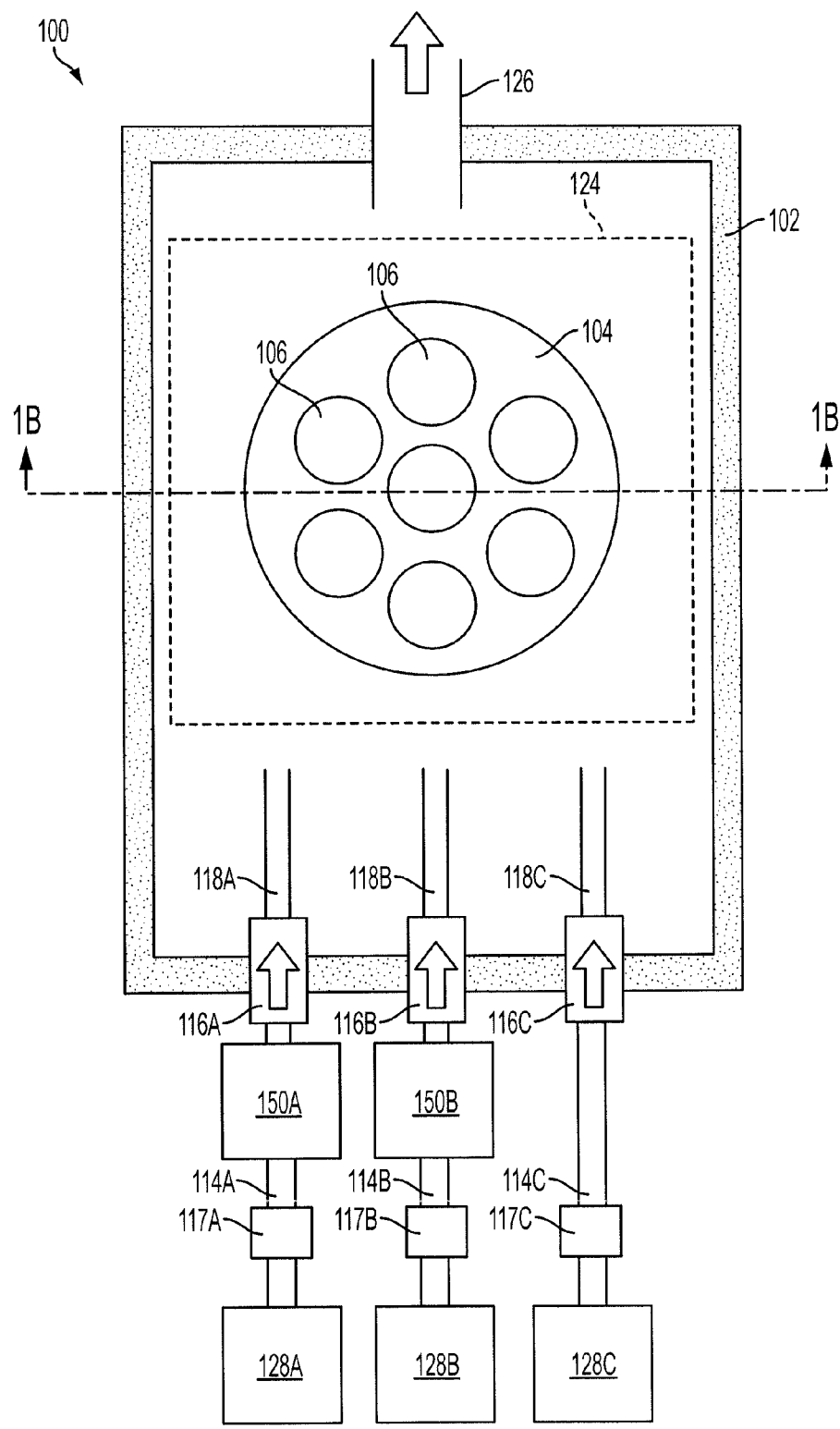
FIG. 1A is a cross-sectional view schematically illustrating an example embodiment of an HVPE deposition system that includes a reaction chamber and at least one gas injector, and that may be employed in embodiments of methods of the invention.

The illustrations presented herein are not meant to be actual views of any particular component, device, or system, but are merely idealized representations which are employed to describe embodiments of the present invention.

A number of references are cited herein, none of the cited references, regardless of how characterized herein, is admitted as prior art relative to the invention of the subject matter claim herein.

As used herein, the term "III-V semiconductor material" means and includes any semiconductor material that is at least predominantly comprised of one or more elements from Group IIIA of the periodic table (B, Al, Ga, In, and Ti) and one or more elements from Group VA of the periodic table (N, P, As, Sb, and Bi). For example, III-V semiconductor materials include, but are not limited to, GaN, GaP, GaAs, InN, InP, InAs, AlN, AlP, AlAs, InGaN, InGaP, InGaNP, etc.

As used herein, the term "III-nitride semiconductor material" means and includes any III-V semiconductor material that is at least predominantly comprised of one or more elements from Group IIIA of the periodic table (B, Al, Ga, In, and Ti) and nitrogen. For example, III-nitride semiconductor materials include GaN, InN, AlN, InGaN, GaAlN, InAlN, etc.

As used herein, the term "metal-nitride" means a compound of metal and nitrogen. Metal-nitride materials include, but are not limited to, aluminum nitride (AlN), gallium nitride (GaN), aluminum gallium nitride ($Al_xGa_{1-x}N$), and titanium nitride (TiN).

As used herein, the terms "chemical vapor deposition" and "CVD" are synonymous and mean and include any process used to deposit solid material(s) on a substrate in a reaction chamber, in which the substrate is exposed to one or more reagent gases, which react, decompose, or both react and decompose in a manner that results in the deposition of the solid material(s) on a surface of the substrate.

As used herein, the terms "vapor phase epitaxy" and "VPE" are synonymous and mean and include any CVD process in which the substrate is exposed to one or more reagent vapors, which react, decompose, or both react and decompose in a manner that results in the epitaxial deposition of the solid material(s) on a surface of the substrate.

As used herein, the terms "halide vapor phase epitaxy" and "HVPE" are synonymous and mean and include any VPE process in which at least one reagent vapor used in the VPE process comprises a halide vapor.

As used herein, the terms "metallorganic" and means and includes any compound comprising at least one metallic element and an organic chemical species. Metallorganics are often referred to in the art as "organometallics," and such terms are synonymous for purposes of this disclosure. Metallorganics include, but are not limited to, trimethylgallium (TMG), triethylgallium (TEG), trimethylaluminum (TMA), triethylaluminum (TEA), tetrakisdiethylaminotitanium (TDEAT), and tetrakis(dimethylamido)titanium (TDMAT).

As used herein, the terms "metallorganic vapor phase epitaxy" and "MOVPE" are synonymous and mean and include any VPE process in which at least one reagent vapor used in the VPE process comprises a metallorganic vapor.

As used herein, the terms "non-metallorganic chemical vapor deposition process" and "non-MOCVD process" are synonymous and mean and include any deposition process that is not a MOCVD process.

As used herein, the terms "non-metallorganic vapor phase epitaxy process" and "non-MOVPE process" are synonymous and mean and include any deposition process that is not a MOVPE process.

As used herein, the term "gas" includes gases (fluids that have neither independent shape nor volume) and vapors (gases that include diffused liquid or solid matter suspended therein), and the terms "gas" and "vapor" are used synonymously herein.

Embodiments of methods of the invention may comprise depositing nucleation template layers and overgrowth layers of III-nitride semiconductor materials in HVPE processes carried out using HVPE systems. Although various configurations of HVPE systems may be employed in embodiments of methods of the invention, an example HVPE system that may be employed in embodiments of the invention is described below with reference to FIGS. 1A, 1B, and 2 through 4 prior to describing embodiments of methods of the invention.

Figure 1B:
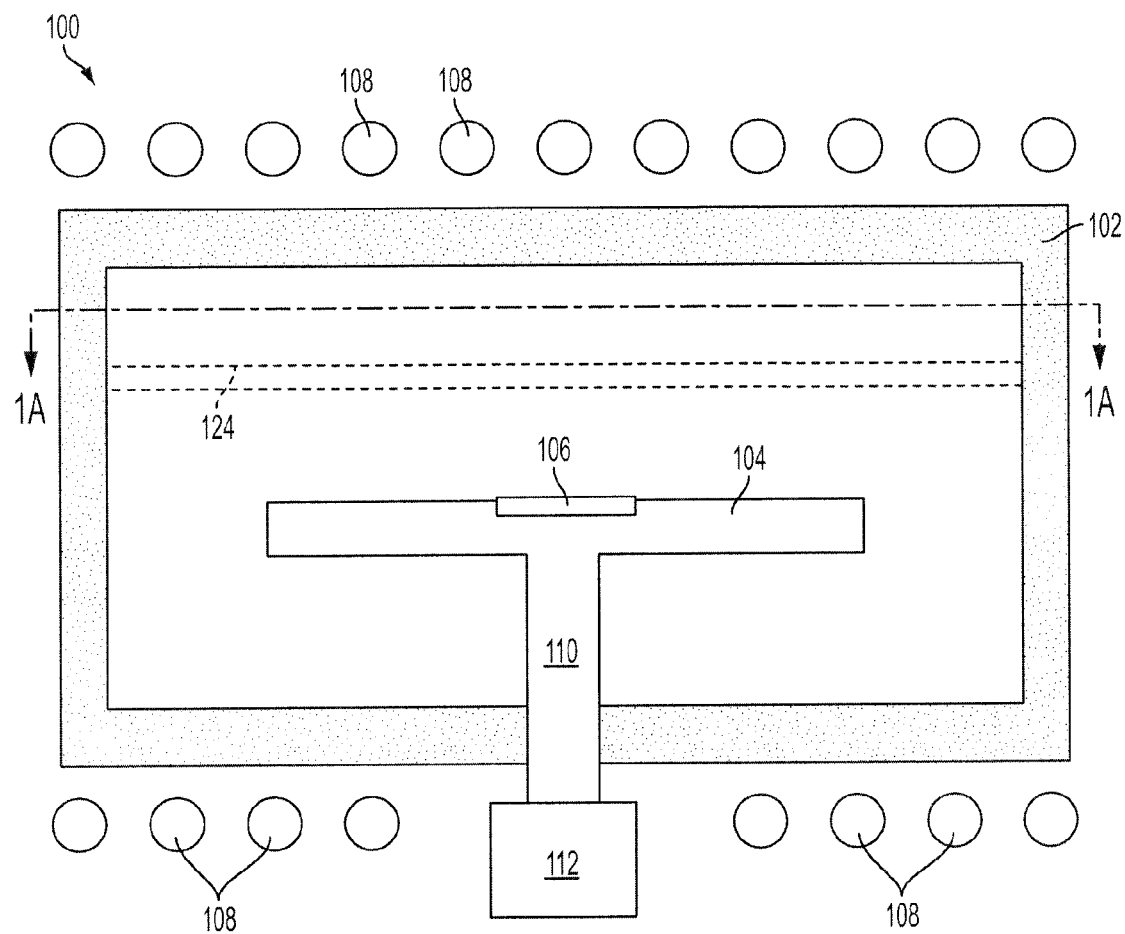
FIG. 1B is a schematic, cross-sectional view of the reaction chamber shown in FIG. 1A taken along Section Line 1B-1B shown therein.

FIGS. 1A and 1B are simplified illustrations schematically illustrating an embodiment of an HVPE deposition system 100 that may be employed in embodiments of methods of the invention, as described herein. As non-limiting examples, the deposition system 100 may comprise a deposition system as described in any of U.S. Patent Application Publication No. US 2009/0223442 A1, which published Sep. 10, 2009 in the name of Arena et al., now U.S. Pat. No. 8,382,898, issued Feb. 26, 2013, provisional U.S. Patent Application Ser. No. 61/157,112, which was filed Mar. 3, 2009 in the name of Arena et al., and U.S. patent application Ser. No. 12/894,724, which was filed Sep. 30, 2010 in the name of Bertran. The deposition system 100 shown in FIGS. 1A and 1B includes a reaction chamber 102 and one or more gas injectors, which are described below with reference to FIGS. 2 through 4.

In the following description of the deposition system 100 and, more particularly, the reaction chamber 102 of the deposition system 100, the terms "longitudinal" and "transverse" are used to refer to the directions relative to the reaction chamber 102 from the perspectives of FIGS. 1A and 1B, wherein the longitudinal direction is the vertical direction from the perspective of FIG. 1A and the direction extending into the plane of FIG. 1B, and the transverse or lateral directions are those extending horizontally from the perspective of each of FIGS. 1A and 1B. The transverse directions are also referred to as directions extending "across the reactor."

The deposition system 100 includes the reaction chamber 102, a substrate support structure 104 (e.g., a susceptor) configured to support one or more workpiece substrates 106 on which it is desired to deposit or otherwise provide material within the deposition system 100. By way of non-limiting example, the reaction chamber 102 may have a height of about two inches, a width of about twelve inches, and a length of about twenty inches, and the substrate support structure 104 may be configured to support one eight inch workpiece substrate 106, one six inch workpiece substrate 106, three four inch workpiece substrates 106, or eight two inch workpiece substrates 106. The deposition system 100 further includes heating elements 108 (FIG. 1B), which may be used to selectively heat the deposition system 100 such that an average temperature within the reaction chamber 102 may be controlled to within desirable elevated temperatures during deposition processes. The heating elements 108 may comprise, for example, resistive heating elements or radiant heating elements.

As shown in FIG. 1B, the substrate support structure 104 may be mounted on a spindle 110, which may be coupled (e.g., directly structurally coupled, magnetically coupled, etc.) to a drive device 112, such as an electrical motor that is configured to drive rotation of the spindle 110 and, hence, the substrate support structure 104 within the reaction chamber 102.

In some embodiments, one or more of the reaction chamber 102, the substrate support structure 104, the spindle 110, and any other components within the reaction chamber 102 may be at least substantially comprised of a refractory ceramic material such as a ceramic oxide (e.g., silica (quartz), alumina, zirconia, etc.), a carbide (e.g., silicon carbide, boron carbide, etc.), or a nitride (e.g., silicon nitride, boron nitride, etc.).

The deposition system 100 further includes a gas flow system used to inject one or more gases into the reaction chamber 102 and to exhaust gases out from the reaction chamber 102. Referring to FIG. 1A, the deposition system 100 may include three gas inflow conduits 114A, 114B, 114C that carry gases from respective gas sources 128A, 128B, 128C. Optionally, devices 117A, 117B, 117C, which may comprise one or more of valves, back pressure regulators, and mass flow controllers, may be used to selectively control the flow of gas through the gas inflow conduits 114A, 114B, 114C, respectively.

In some embodiments, at least one of the gas sources 128A, 128B may comprise an external source of at least one of a metal trichloride (such as $GaCl_3$, $InCl_3$, or $AlCl_3$) and a metal tetrachloride (such as $TiCl_4$), as described in U.S. Patent Application Publication No. US 2009/0223442 A1, now U.S. Pat. No. 8,382,898, issued Feb. 26, 2013. $GaCl_3$, $InCl_3$ and $AlCl_3$ may exist in the form of a dimer such as, for example, $Ga_2Cl_6$, $In_2Cl_6$ and $Al_2Cl_6$, respectively. Thus, at least one of the gas sources 128A, 128 may comprise a dimer such as $Ga_2Cl_6$, $In_2Cl_6$ or $Al_2Cl_6$. As a non-limiting example, one or more of the gas sources 128A, 128B may provide a mass flow of $GaCl_3$ vapor as a Group IIIA precursor component. The gas source 128C may comprise an external source of a Group VA precursor, such as ammonia ($NH_3$).

In embodiments in which one or more of the gas sources 128A, 128B is or includes a $GaCl_3$ source, the $GaCl_3$ source include a reservoir of liquid $GaCl_3$ maintained at a temperature of at least 120° C. (e.g., approximately 130° C.), and may include physical means for enhancing the evaporation rate of the liquid $GaCl_3$. Such physical means may include, for example, a device configured to agitate the liquid $GaCl_3$, a device configured to spray the liquid $GaCl_3$, a device configured to flow carrier gas rapidly over the liquid $GaCl_3$, a device configured to bubble carrier gas through the liquid $GaCl_3$, a device, such as a piezoelectric device, configured to ultrasonically disperse the liquid $GaCl_3$, and the like. As a non-limiting example, a carrier gas, such as He, $N_2$, $H_2$, or Ar, or a mixture thereof (e.g., a mixture of $N_2$ and $H_2$) may be bubbled through the liquid $GaCl_3$, while the liquid $GaCl_3$ is maintained at a temperature of at least 120° C., such that the source gas may include one or more carrier gases.

The flux of the $GaCl_3$ vapor into one or more of the gas injectors 150A, 150B may be controlled in some embodiments of the invention. For example, in embodiments in which a carrier gas is bubbled through liquid $GaCl_3$, the $GaCl_3$ flux from the gas source 128A, 128B, 128C is dependent on one or more factors, including for example, the temperature of the $GaCl_3$, the pressure over the $GaCl_3$, and the flow of carrier gas that is bubbled through the $GaCl_3$. While the mass flux of $GaCl_3$ can in principle be controlled by any of these parameters, in some embodiments, the mass flux of $GaCl_3$ may be controlled by varying the flow of the carrier gas using a mass flow controller.

In some embodiments, the temperatures of the gas inflow conduits 114A, 114B may be controlled between the gas sources 128A, 128B and the gas injectors 150A, 150B. The temperatures of the gas inflow conduits 114A, 114B and associated mass flow sensors, controllers, and the like may increase gradually from a first temperature (e.g., about 120° C. or more) at the exit from the respective gas sources 128A, 128B up to a second temperature (e.g., about 160° C. or less) at the gas injectors 150A, 150B in order to prevent condensation of the gases (e.g., $GaCl_3$ vapor) in the gas inflow conduits 114A, 114B and the like. Optionally, the length of the gas inflow conduits 114A, 114B between the respective gas sources 128A, 128B and the gas injectors 150A, 150B may be about three feet or less, about two feet or less, or even about one foot or less. The pressure of the source gasses may be controlled using one or more pressure control systems.

Each of the two gas inflow conduits 114A, 114B optionally may extend to a respective one of two gas injectors 150A, 150B, which are described in further detail below.

In additional embodiments, the deposition system 100 may include less than two (i.e., one) gas inflow conduits and respective gas injectors, or the deposition system 100 may include more than two (e.g., three, four, five, etc.) gas inflow conduits and respective gas injectors.

In the embodiment of FIGS. 1A and 1B, the gas injectors 150A, 150B are located entirely outside the reaction chamber 102. In other embodiments, however, the gas injectors 150A, 150B may be disposed entirely within the reaction chamber 102, or at least a portion of the gas injectors 150A, 150B may extend at least partially through the reaction chamber 102.

The deposition system 100 may further include three gas ports 116A, 116B, 116C that provide fluid communication between the exterior and the interior of the reaction chamber 102. Each of the gas ports 116A, 116B, 116C may provide fluid communication through one or more of a wall, the ceiling or the floor of the reaction chamber 102 between a respective one of the gas injectors 150A, 150B and a respective gas dispersion conduit 118A, 118B, 118C within the reaction chamber 102.

The gas dispersion conduits 118A, 118B, 118C within the reaction chamber 102 may be used to carry the gases to desirable locations within the enclosure. The gas dispersion conduits 118A, 118B, 118C may be located and configured to inject gases into the interior of the reaction chamber 102 in selected directions relative to the workpiece substrates 106 carried upon the substrate support structure 104. Gases carried by the gas dispersion conduits 118A, 118B, 118C, such as precursor gases and carrier gases, may flow in the longitudinal direction through the reaction chamber 102 (the vertical direction from the perspective of FIG. 1A) and may be injected out therefrom in directions extending toward the workpiece substrates 106 longitudinally within the reaction chamber 102, the directions being oriented at least substantially parallel to upper exposed major surfaces of the workpiece substrates 106. The gas dispersion conduits 118A, 118B, 118C may be supported and held in place within the reaction chamber 102 using conduit support fixtures.

The particular layout and configuration of the gas dispersion conduits 118A, 118B, 118C is merely one of many layouts and configurations that may be used in embodiments of the invention, and additional embodiments of reaction chambers 102 may have different configurations and layouts of gas dispersion conduits within the reaction chamber 102.

The gas dispersion conduits 118A, 118B, 118C may be actively heated, passively heated, or both passively and actively heated. For example, heat producing elements (not shown) may be positioned adjacent to at least a portion of the gas dispersion conduits 118A, 118B, 118C. In some embodiments, the gas dispersion conduits 118A, 118B, 118C are heated by the heating elements 108 (FIG. 1B). Optionally, passive heat transfer structures (e.g., structures comprising materials that behave similarly to a black body) may be located adjacent or proximate to at least a portion of the gas dispersion conduits 118A, 118B, 118C within the reaction chamber 102 to improve transfer of heat to the gas dispersion conduits 118A, 118B, 118C.

Passive heat transfer structures (e.g., structures comprising materials that behave similarly to a black body) may be provided within the reaction chamber 102 as disclosed in, for example, U.S. Patent Application Publication No. US 2009/0214785 A1, now U.S. Pat. No. 8,388,755, issued Mar. 5, 2013, which published on Aug. 27, 2009 in the name of Arena et al. For example, a heat transfer plate 124 (represented in FIGS. 1A and 1B by a dashed line) may be positioned within the reaction chamber 102 such that the heat transfer plate 124 extends across the reaction chamber 102 over the substrate support structure 104 and the workpiece substrates 106 supported by the substrate support structure 104. The heat transfer plate 124 may aid in thermalizing process gases flowing in proximity to the heat transfer plate 124 by absorbing radiation from heating elements (such as the heating elements 108), and reradiating the absorbed heat into the process gases.

Such a passive heat transfer structure may improve the transfer of heat within the interior of the reaction chamber 102, and may improve the homogeneity and consistency of the temperature within the reaction chamber 102. The passive heat transfer structures may comprise materials with high emissivity values (close to unity) (black body materials) that are also capable of withstanding the high temperature, corrosive environments that may be encountered within the deposition system 100. Such materials may include, for example, aluminum nitride (AlN), silicon carbide (SiC), and boron carbide ($B_4C$), which have emissivity values of 0.98, 0.92, and 0.92, respectively.

Gaseous byproducts, carrier gases, and any excess precursor gases may be exhausted out from the reaction chamber 102 through a chamber outlet 126.

As previously mentioned, one or more of the gas injectors 150A, 150B of the deposition system 100 of FIGS. 1A and 1B may be or include a gas injector as described in further detail below with reference to FIGS. 2 through 4.

In some embodiments, the gas injectors 150A, 150B may comprise gas injectors as disclosed in International Publication Number WO 2010/101715 A1, which published Sep. 10, 2010 in the name of Arena et al. For example, FIG. 2 is a perspective view of a thermalizing gas injector 160, which may be used for one or both of the gas injectors 150A, 150B shown in FIG. 1A. As shown in FIG. 2, the gas injector 160 includes a conduit 162, which includes an inlet portion 164, a coiled central portion 166, and an outlet portion 168. A source gas (e.g., $GaCl_3$), a carrier gas (e.g., $H_2$, $N_2$, etc.), or a mixture of a source gas and a carrier gas, may be supplied to the inlet portion 164. The gas or gases flow from the inlet portion 164, through the coiled central portion 166, out through the outlet portion 168 and into the reaction chamber 102 (FIG. 1A). At least the coiled central portion 166 of the conduit 162 may be heated, as discussed in further detail below. By coiling the conduit 162, a length of the physical space occupied by the conduit 162 is significantly less than the actual length of the flow path through the conduit 162. Stated another way, a length of the conduit 162 may be longer than a shortest distance between the inlet portion 164 and the outlet portion 168. The conduit 162 may have other configurations. For example, the conduit 162 may have a serpentine configuration that includes a plurality of generally parallel straight sections connected together in an end-to-end fashion by curved sections that extend through an angle of 180°.

The conduit 162 may be configured to heat the gas flowing through the conduit 162 for a desirable amount of time (i.e., a residence time), which may be a function of the cross-sectional area of the flow path within the conduit 162, the flow rate of the source gas through the conduit 162, and the overall length of the conduit 162. The conduit 162 may be shaped and configured to be located proximate to one or more active or passive heating elements, as discussed in further detail below.

Figure 2:
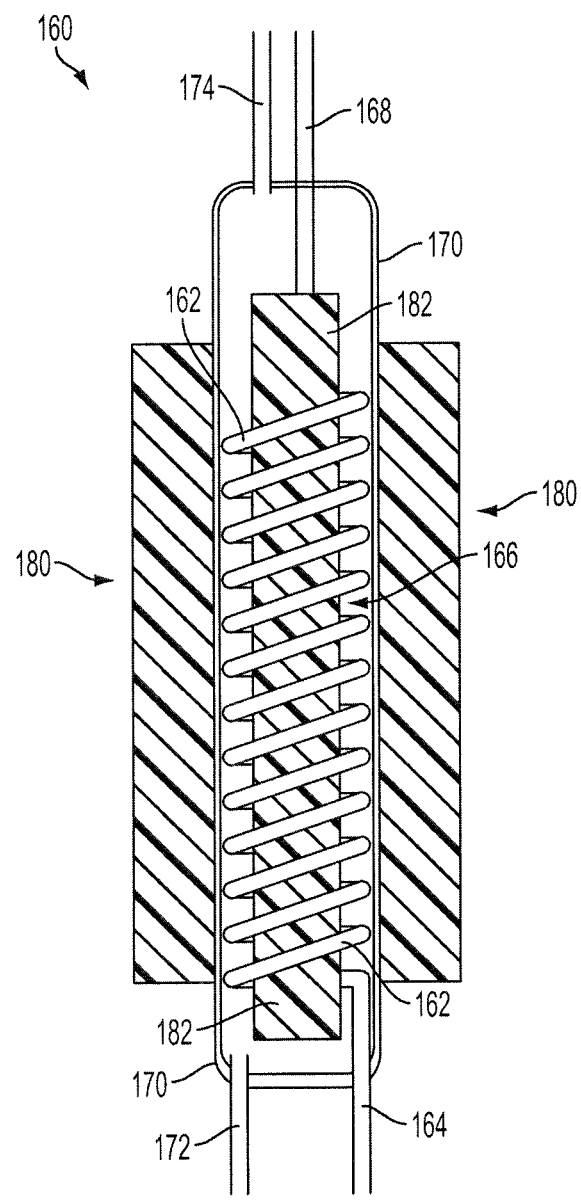
FIG. 2 schematically illustrates an embodiment of a thermalizing gas injector that may be employed in the deposition system of FIG. 1A.

As shown in FIG. 2, at least the coiled central portion 166 of the conduit 162 may be contained within an outer housing 170. The outer housing 170 also may serve as an additional gas-conducting conduit for gases such as purge gases, which also may be directed into the reaction chamber 102, although not illustrated in the figures. For example, as shown in FIG. 2, the outer housing 170 may comprise a housing inlet 172 and a housing outlet 174 that may extend into the reaction chamber 102. Purge gas may be caused to flow through the outer housing 170 from the housing inlet 172 to the housing outlet 174, and subsequently into the reaction chamber 102. The purge gas may be heated by the thermalizing gas injector 160 as it passes through the outer housing 170.

The conduit 162 and the outer housing 170 may comprise a refractory material that is stable and inert at elevated temperatures to which they are subjected during use. For example, the conduit 162 and the outer housing 170 may be formed from and at least substantially comprised of quartz.

The thermalizing gas injector 160 may be heated using active heat producing elements position proximate (e.g., adjacent) to one or more of the outer housing 170 and the coiled central portion 166 of the conduit 172. Active heating elements include radiation emitting elements such as heat lamps, inductive heating elements, electrical heating elements such as resistive heating elements, and so forth. The thermalizing gas injector 160 may also include passive heating elements that do not generate heat themselves, but that are used to redistribute, reflect, or otherwise affect heat transfer in and around the thermalizing gas injector 160. For example, as shown in FIG. 2, the thermalizing gas injector 160 may include an active heating element 180, which may comprise a resistively heated clamp-shell heater that at least partially surrounds the exterior of the outer housing 170. Thus, gases flowing through the conduit 162 and/or the outer housing 170 may be heated by the active heating element 180. As shown in FIG. 2, an optional heating element 182, which may be active or passive, may be disposed within the outer housing 170. The heating element 182 may have an elongated cylindrical shape, and the coiled central portion 166 of the coil 162 may be coiled around the heating element 182, as shown in FIG. 2. By way of example and not limitation, the heating element 182 may comprise a rod comprising a black body material that is used to re-distribute heat generated by the active heating element 180. The presence of the heating element 182 may improve the efficiency by which the gases within the coiled central portion 166 of the coil 162 and the gases within the outer housing 170 are heated by the active heating element 180.

In embodiments of the invention in which the source gas supplied to the thermalizing gas injector 160 by one of the gas sources 128A, 128B comprises a metal trichloride such as $GaCl_3$ and hydrogen carrier gas $H_2$, the metal trichloride and the hydrogen gas may decompose to form a metal monochloride vapor such as GaCl and HCl vapor, which vapors may be passed out the outlet portion 168 of the conduit 162 and to the reaction chamber 102.

In additional embodiments, the gas injectors 150A, 150B may comprise gas injectors as disclosed in U.S. patent application Ser. No. 12/894,724, now U.S. Pat. No. 8,486,192, issued Jul. 16, 2013. For example, gas injectors 150A, 150B may comprise a reservoir configured to hold a liquid metal or other element, such as, for example, liquid gallium (Ga), liquid aluminum (Al), or liquid indium (In). In further embodiments, the reservoir may be configured to hold a solid reagent for reacting with a source gas (or a decomposition or reaction product of a source gas). For example, the reservoir may be configured to hold a solid volume of one or more materials, such as, for example, solid silicon (Si) or solid magnesium (Mg).

Figures 3, 4:
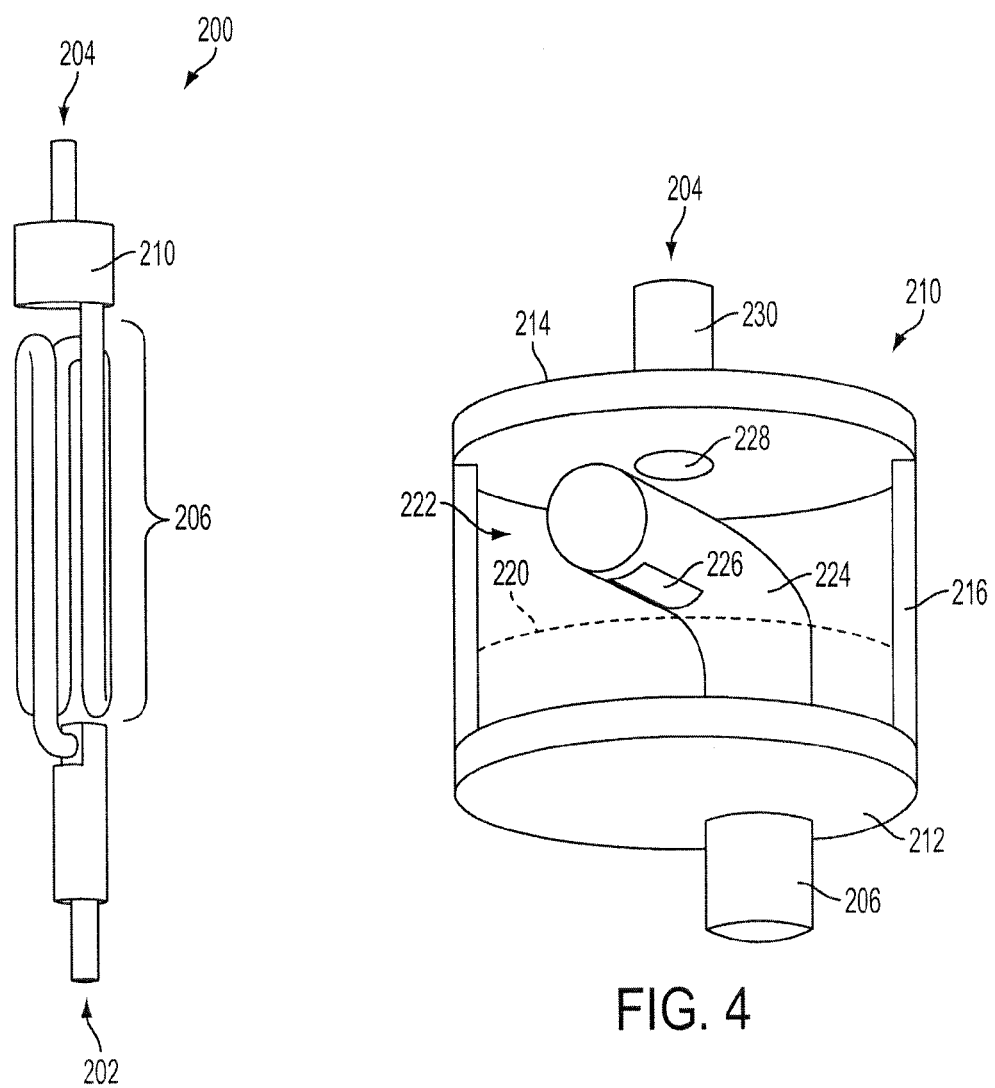
FIG. 3 schematically illustrates another example embodiment of a gas injector that may be employed in the deposition system of FIG. 1A.
FIG. 4 is an enlarged, partially cut-away view of a portion of the gas injector of FIG. 3.

FIG. 3 is a perspective view of a gas injector 200, which may be used for one or both of the gas injectors 150A, 150B shown in FIG. 1A. As shown in FIG. 3, the gas injector 200 includes an inlet 202, an outlet 204, a thermalizing conduit 206, and a container 210. The container 210 is configured to hold a liquid reagent therein. For example, a liquid metal such as liquid gallium, liquid indium, liquid aluminum, etc., or a liquid organometallic substance, may be disposed within the container 210. A source gas (e.g., $GaCl_3$), a carrier gas (e.g., $H_2$, $N_2$, etc.), or a mixture of a source gas and a carrier gas, may be supplied to the inlet 202. The gas or gases may flow from the inlet 202 into the thermalizing conduit 206. The thermalizing conduit 206 may be configured to heat the gas flowing through the thermalizing conduit 206 for a desirable amount of time (i.e., a residence time), which may be a function of the cross-sectional area of the flow path within the thermalizing conduit 206, the flow rate of the source gas through the thermalizing conduit 206, and the overall length of the thermalizing conduit 206. The thermalizing conduit 206 may be shaped and configured to be located proximate to one or more active or passive heating elements, as discussed in further detail below.

Furthermore, the thermalizing conduit 206 may include one or more curved sections or turns, such that the length of the physical space occupied by the thermalizing conduit 206 is significantly less than the actual length of the flow path through the thermalizing conduit 206. Stated another way, a length of the thermalizing conduit 206 may be longer than a shortest distance between the inlet 202 and the liquid container 210. In some embodiments, the length of the thermalizing conduit 206 may be at least about twice the shortest distance between the inlet 202 and the liquid container 210, at least about three times the shortest distance between the inlet 202 and the liquid container 210, or even at least about four times the shortest distance between the inlet 202 and the liquid container 210. For example, the thermalizing conduit 206 may have a serpentine configuration, as shown in FIG. 3, which includes a plurality of generally parallel straight sections connected together in an end-to-end fashion by curved sections that extend through an angle of 180°.

The thermalizing conduit 206 may comprise a tube that is at least substantially comprised of a refractory material such as, for example, quartz.

In some embodiments, the gas may comprise a source gas that at least partially decomposes within the thermalizing conduit 206. For example, in embodiments in which the gas comprises a source gas of $GaCl_3$ and a carrier gas comprising $H_2$, the source gas may decompose to form gaseous GaCl and hydrogen chloride (HCl).

Figure 6:
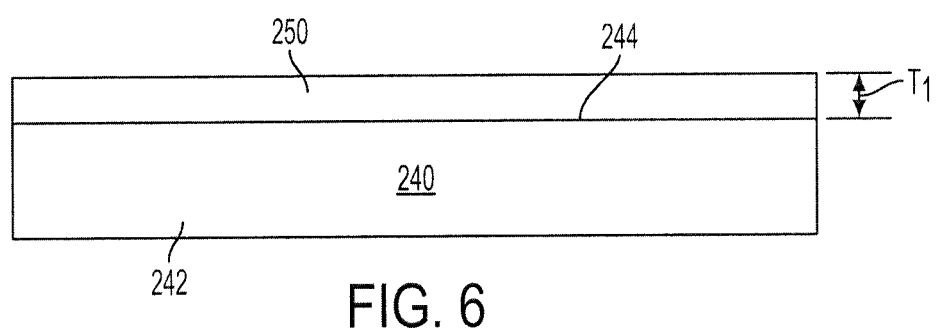
FIG. 6 is a simplified cross-sectional view illustrating a nucleation layer deposited on the substrate of FIG. 5 that comprises amorphous and crystalline regions in a microstructure thereof.
Figure 7:
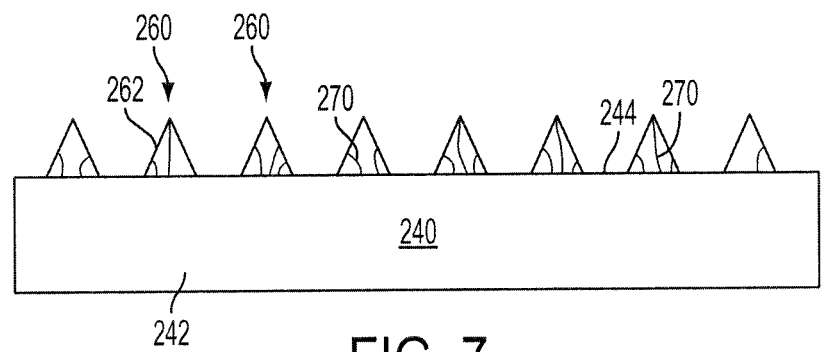
FIG. 7 is a simplified cross-sectional view illustrating substantially crystalline islands of nucleation material formed by annealing the nucleation layer shown in FIG. 6.

The gases flow from the thermalizing conduit 206 into the container 210. FIG. 4 is an enlarged, partially cut-away view of the container 210. As shown in FIG. 4, the container 210 includes a bottom wall 212, a top wall 214, and at least one side wall 216. In the embodiment of FIGS. 6 and 7, the reservoir has a generally cylindrical shape, such that each of the bottom wall 212 and the top wall 214 has a circular shape and is at least substantially planar, and such that the side wall 216 is at least substantially cylindrical (e.g., tubular). In additional embodiments of the invention, the reservoir may be configured in alternative geometrical configurations. The bottom wall 212, the top wall 214, and the at least one side wall 216 together define a hollow body, the interior of which defines a reservoir for holding a liquid reagent, such as liquid gallium or an organometallic substance.

The interior space within the hollow container 210 may be partially filled with a liquid reagent. For example, the container 210 may be filled with a liquid reagent to the level indicated by the dashed line 220 in FIG. 4, such that a void or space 222 is present over the liquid reagent within the container 210. Gases flowing out from the thermalizing conduit 206 may be injected into the space 222 over the liquid reagent within the container 210. As a non-limiting example, the gases flowing out from the thermalizing conduit 206 may flow through the bottom wall 212 into a tube 224. In some embodiments, the tube 224 may comprise an integral portion of the thermalizing conduit 206 that extends into the container 210. The tube 224 may extend through the liquid reagent disposed within the liquid container to the space 222 over the liquid reagent. The tube 224 may comprise a ninety degree bend, such that an end portion of the tube 224 extends horizontally over the liquid reagent.

As shown in FIG. 4, an aperture may be provided through the cylindrical sidewall of the tube 224 on a side thereof facing the surface of the liquid reagent, such that gases flowing through the tube 224 will exit the tube 224 through the aperture 226. The gases exiting the aperture 226 may be directed out from the aperture in a direction oriented toward the surface of the liquid reagent to promote reaction between one or more components of the gases and the liquid reagent. For example, in embodiments in which the source gas comprises $GaCl_3$ carried within a carrier gas such as $H_2$, and the source gas has decomposed to include gaseous GaCl and a chlorinated species such as, for example, hydrogen chloride (HCl) within the thermalizing conduit 206, the liquid reagent within the liquid container may comprise liquid gallium, which may react with the chlorinated gas (e.g., HCl) generated within the thermalizing conduit 206 to form additional gaseous GaCl. The gases within the space 222 over the liquid reagent within the container 210 may flow out from the container through an outlet port 228. For example, the outlet port 228 may be located in the top wall 214 of the container over the horizontally extending portion of the tube 224. The outlet port 228 may lead to an outlet conduit 230, the end of which may define the outlet 204 of the gas injector 200.

In additional embodiments, the gases flowing out from the thermalizing conduit 206 may be injected into the liquid reagent within the container 210, such that the gases are bubbled up through the liquid reagent into the space 222 over the liquid reagent.

The various components of the container 210 may be at least substantially comprised of a refractory material such as, for example, quartz.

The GaCl may be a desirable precursor gas for forming GaN. Thus, by converting the excess chlorinated species such as, for example, hydrogen chloride gas (HCl) that results from thermal decomposition of $GaCl_3$ and $H_2$ (in systems that employ a source gas comprising $GaCl_3$ and $H_2$) into additional GaCl, detrimental effects of excess chlorinated species to the deposited GaN material may be avoided, since the amount of chlorinated species entering the reaction chamber 102 may be reduced. Such detrimental effects may include, for example, incorporation of chlorine atoms into the gallium nitride crystal lattice and cracking or delamination of the deposited GaN film. Introducing excess hydrogen chloride gas (HCl) into the reaction chamber may result in the hydrogen chloride acting as an etchant to the GaN within the reaction chamber, thereby reducing the growth rate or even preventing growth of the GaN. Furthermore, by reacting the excess chlorinated species with the liquid gallium to form additional GaCl, the efficiency of the deposition system 100 may be improved.

The HVPE deposition system 100 described above with reference to FIGS. 1A and 1B may be used to deposit a nucleation layer over a substrate, to anneal the nucleation layer to form islands of nucleation material, and to deposit overgrowth layers of III-nitride semiconductor material over the islands of nucleation material in accordance with embodiments of methods of the invention, as described below.

FIGS. 5 through 10 illustrate the deposition of a nucleation layer over a substrate, the annealing of the nucleation layer to form islands of nucleation material, and the deposition of overgrowth layers of III-nitride semiconductor material over the islands of nucleation material in accordance with embodiments of methods of the invention.

Figure 5:
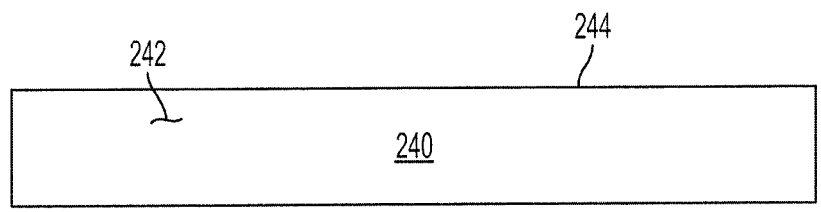
FIG. 5 is a simplified cross-sectional view of a substrate that may be employed in accordance with embodiments of methods of the invention.

Referring to FIG. 5, a substrate 240 is provided. The substrate 240 may be a generally planar, disc-shaped body, and may be generally circular, rectangular, etc. The substrate 240 may comprise what is referred to in the art as a "die" or "wafer." The substrate 240 may be at least substantially comprised of a homogenous material 242. The material 242 may comprise, for example, a ceramic such as an oxide (e.g., silicon dioxide ($SiO_2$) or aluminum oxide ($Al_2O_3$) (e.g., sapphire, which is $\alpha$-$Al_2O_3$)) or a nitride (e.g., silicon nitride ($Si_3N_4$) or boron nitride (BN)). As additional examples, the material 242 may comprise a semiconductor material such as silicon (Si), germanium (Ge), a III-V semiconductor material, etc. In some embodiments, the material 242 of the substrate 240 may be at least substantially comprised of a single crystal of the material 242. Furthermore, in such embodiments, the single crystal may have a selected crystallographic orientation, such that an exposed major surface 244 of the material 242 comprises a selected crystallographic plane of the single crystal of the material 242. The exposed major surface 244 comprises a growth surface on which it is desired to grow or otherwise deposit a III-nitride semiconductor material. As a non-limiting example, the substrate 240 may be selected to comprise an (0001) sapphire substrate. Such sapphire substrates are commercially available.

Referring to FIG. 6, a nucleation layer 250 may be formed (e.g., deposited) on the exposed major surface 244. In accordance with embodiments of methods of the invention, the nucleation layer 250 may comprise a metal-nitride material (e.g., GaN), and may be formed using an HVPE process and an HVPE system 100, as described above. By way of example and not limitation, the nucleation layer 250 may be deposited on the exposed major surface 244 such that the nucleation layer 250 has an average thickness $T_1$ of between about two nanometers (2 nm) and about five microns (5 μm), between about ten nanometers (10 nm) and about one hundred nanometers (100 nm), or even between about twenty nanometers (20 nm) and about fifty nanometers (50 nm). Further, the nucleation layer 250 may be deposited at relatively low temperatures of, for example, between about 400° C. and about 700° C. (e.g., about 570° C.) and at pressures between about 50 Torr and about 760 Torr (1 atmosphere) (e.g., about 200 Torr).

Figure 11:
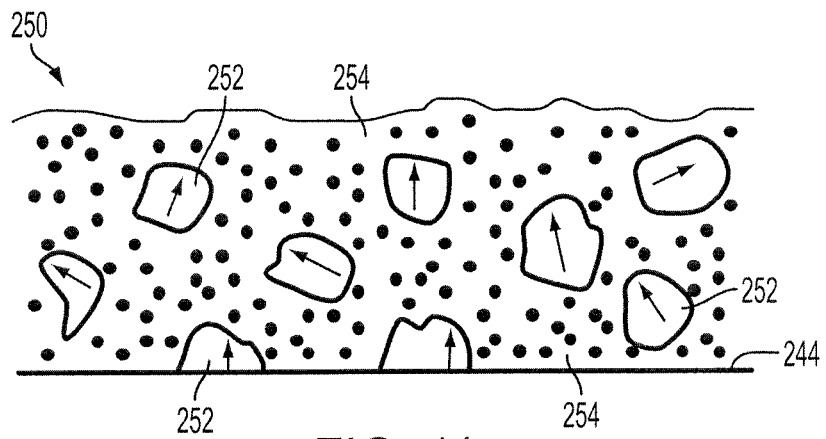
FIGS. 11-13 are simplified drawings illustrating a mechanism by which the nucleation layer of FIG. 6 may be converted to islands of nucleation material like those shown in FIG. 7.

Upon deposition, the nucleation layer 250 may comprise both amorphous and crystalline regions within the nanostructure thereof. For example, FIG. 11 is a simplified drawing schematically illustrating how a cross-sectional view of the nucleation layer 250 may appear under magnification. As shown in FIG. 11, the microstructure of the nucleation layer 250 may include grains of crystalline metal nitride material 252 (i.e., crystals or crystallites) embedded within and surrounded by substantially amorphous metal nitride material 254. As known in the art, "amorphous" means that there is substantially no long range order in the arrangement of the atoms of the material. In other words, the atoms of amorphous material are generally randomly arranged within the material, as opposed to being arranged in an ordered array of atomic planes within the material. It should be noted that the drawing of FIG. 11 is simplified, and, although identifiable, discrete boundaries are readily visible between the grains of crystalline metal nitride material 252 and the amorphous metal nitride material 254 in FIG. 11, in practice, such discrete boundaries extending around the peripheries of the grains of crystalline metal nitride material 252 may be relatively difficult to identify when the microstructure is viewed under magnification. Even so, the presence of the grains of crystalline metal nitride material 252 and the amorphous metal nitride material 254 can be identified upon viewing the microstructure under suitable magnification and/or using other techniques, such as X-ray diffraction (XRD).

Some grains of crystalline metal nitride material 252 may be disposed directly on and epitaxially aligned with the crystal lattice of the underlying surface 244 of the substrate 240 (FIG. 5). For example, in embodiments in which the substrate 240 comprises a (0001) sapphire substrate and the nucleation layer 250 comprises gallium nitride (GaN), the surface 244 may comprise the (0001) plane of the sapphire crystal lattice, and the grains of crystalline GaN material 252 that are disposed directly on the surface 244 of the substrate 240 may be oriented such that the directions within the crystal lattices of those grains of crystalline GaN material 252 extend substantially perpendicular to the surface 244. The [0001] directions within each of the grains of crystalline metal nitride material 252 in FIG. 11 are represented by the directional arrows within the grains. Other directions within the crystal lattices of those grains of crystalline GaN material 252 also may extend substantially parallel to the corresponding directions within the crystal lattice of the underlying sapphire substrate 240 at the surface 244, such that there is little to no mismatch in the rotational orientation of those grains in the horizontal plane (i.e., the plane extending into the plane of the figures) relative to the crystal lattice of the underlying sapphire substrate 240 at the surface 244.

As also shown in FIG. 11, the grains of crystalline metal nitride material 252 that are not disposed directly on the underlying surface 244 of the substrate 240 (FIG. 5) may not be epitaxially aligned with the crystal lattice of the underlying surface 244 of the substrate 240, and may be randomly oriented in space, as indicated by the directional arrows within each of the grains of crystalline metal nitride material 252 that indicate the [0001] directions within the crystal lattice. Of course, some of the [0001] directions may extend at angles into and out from the plane of FIG. 11 although such directions are not indicated in the figure.

In embodiments in which the grains of crystalline metal nitride material 252 comprise gallium nitride (GaN), some or all of the grains of crystalline metal nitride material 252 may be or comprise grains at least substantially comprised of the wurtzite crystal structure, and/or some or all of the grains may be or comprise grains at least substantially comprised of the zinc blend crystal structure. Further, in some embodiments, the grains of crystalline metal nitride material 252 may have an inner core of one crystal structure, such as the zinc blend crystal structure, and an outer shell at least partially surrounding the inner core having another crystal structure, such as the wurtzite crystal structure.

Referring again to FIG. 6, after forming the nucleation layer 250 on the surface 244 of the substrate 240, the nucleation layer 250 may be thermally treated in an annealing process to form islands 260 of metal nitride nucleation material on the surface 244 of the substrate 240, as shown in FIG. 7. The nucleation layer 250 may be subjected to the annealing process in the same reaction chamber 102 in which the nucleation layer 250 is deposited on the substrate 240, and the annealing process may be carried out subsequent to the deposition process as an integral part of an overall HVPE process used to form III-nitride semiconductor material on the substrate 240. By way of example and not limitation, the annealing process may comprise subjecting the nucleation layer 250 to a temperature or temperatures between about 900° C. and about 1300° C. (e.g., about 1050° C.) and pressures between about 50 Torr and about 760 Torr (1 atmosphere) (e.g., about 200 Torr) for a time of between about ten seconds (10 sec) and about ten minutes (10 min) (e.g., about 3.5 minutes).

In some embodiments, each of the islands 260 of metal nitride nucleation material may be at least substantially crystalline, and may be disposed directly on and epitaxially aligned with the crystal lattice of the underlying surface 244 of the substrate 240. For example, in embodiments in which the substrate 240 comprises an (0001) sapphire substrate and the islands 260 comprise gallium nitride (GaN), the surface 244 may comprise the (0001) plane of the sapphire crystal lattice, and the crystal structure of the islands 206 of GaN may be oriented such that the directions within the crystal lattices extend substantially perpendicular to the surface 244. Additionally, other directions within the crystal lattices of the islands 206 of GaN also may extend substantially parallel to the corresponding directions within the crystal lattice of the underlying sapphire substrate 240 at the surface 244, such that there is little to no mismatch in the rotational orientation of those grains in the horizontal plane (i.e., the plane extending into the plane of the figures) relative to the crystal lattice of the underlying sapphire substrate 240 at the surface 244. In some embodiments, some or all of the islands 260 of metal nitride nucleation material may be spatially separated from adjacent islands 260, such that at least a portion of the surface 244 of the substrate 240 is exposed between the islands 260. It should be noted that the base of at least some of the islands 260 may directly contact the base of one or more other adjacent islands 260, such that the islands are not entirely isolated from all other islands 260.

In addition, in some embodiments, the islands 260 may be at least substantially comprised of wurtzite nucleation material.

Further, although the islands 260 appear to be uniformly separated from one another and disposed in an ordered array in FIG. 7, it should be understood that the figure is simplified for purposes of illustration, and the islands 260 may be randomly located and distributed across the surface 244 of the substrate 240 in practice.

In embodiments in which the islands 260 comprise gallium nitride (GaN), some or all of the grains of the crystalline islands 260 may be or comprise grains of the wurtzite crystal structure, and/or some or all of the grains may comprise grains of the zinc blend crystal structure. Further, in some embodiments, the grains of the islands 260 may have an inner core of one crystal structure, such as the zinc blend crystal structure, and an outer shell at least partially surrounding the inner core having another crystal structure, such as the wurtzite crystal structure.

Figure 12:
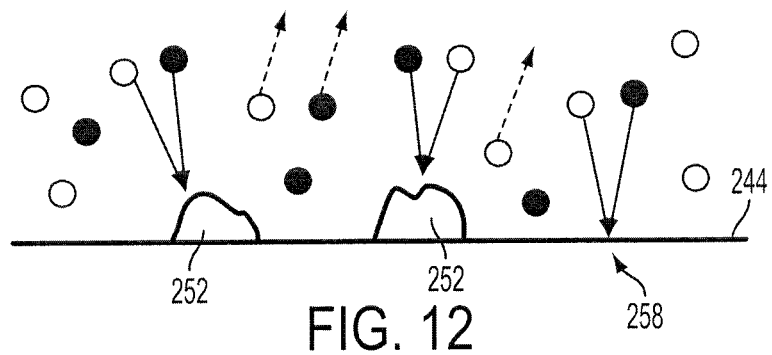

Without being bound by theory, it is believed that the mechanism by which the metal nitride nucleation layer 250 is converted to the islands 260 of metal nitride nucleation material during the annealing process involves decomposition and redeposition of at least a portion of the metal nitride nucleation layer 250. Such processes are schematically illustrated in FIG. 12. As shown in FIG. 12, during the annealing and crystallization process, at least a portion of the nucleation layer 250 is decomposed and vaporized. As an example, for GaN material, the sold black circles may represent nitrogen atoms and radicals, and the hollow circles may represent gallium atoms and radicals. Some of the nitrogen and gallium atoms and radicals are decomposing and vaporizing, as represented by the dashed direction arrows in FIG. 12 pointing away from the surface 244 of the substrate 240 (FIG. 2). As the substantially amorphous metal nitride material 254 and the grains of crystalline metal nitride material 252 that are not disposed on and epitaxially aligned with the growth surface 244 of the substrate 240 are believed to be less energetically stable relative to the grains of crystalline metal nitride material 252 that are disposed on and epitaxially aligned with the growth surface 244 of the substrate 240, the amorphous material 254 and the non-epitaxially aligned grains of crystalline metal nitride material 252 may decompose while the epitaxially aligned grains of crystalline metal nitride material 252 may remain on the surface 244 of the surface 244 of the substrate 240.

Further, during the annealing and recrystallization process, the decomposed and vaporized nitrogen and gallium atoms and radicals may recombine and deposit on the surfaces of the epitaxially aligned grains of crystalline metal nitride material 252 remaining on the surface 244 of the surface 244 of the substrate 240, as represented in FIG. 12 by the solid directional arrows. Further, some of the decomposed and vaporized nitrogen and gallium atoms and radicals may recombine and nucleate additional epitaxially aligned grains of crystalline metal nitride material 252, as is shown occurring at the location 258 in FIG. 12.

As the annealing and recrystallization process continues, the epitaxially aligned grains of crystalline metal nitride material 252 continue to grow until the islands 260 shown in FIG. 7 are formed. After the annealing and recrystallization process, there may be little to no amorphous metal nitride material 254 (FIG. 11) remaining over the surface 244 of the substrate 240. Further, most of the islands 260 may be epitaxially aligned with the surface 244 of the substrate 240, although there may be a few islands 260 that are not substantially epitaxially aligned with the surface 244 of the substrate 240.

As discussed in further detail below, in accordance with some embodiments of the invention, the parameters of the HVPE deposition process used to form the nucleation layer 250 of FIG. 6, and the parameters of the thermal treatment process used to anneal and recrystallize the nucleation layer 250 to form the islands 260 shown in FIG. 7, may be selected such that a majority of the islands 260, if not substantially all of the islands 260, are sharp, peak-shaped islands 260, as shown in FIG. 7, as opposed to mesa-shaped islands.

Figure 13:
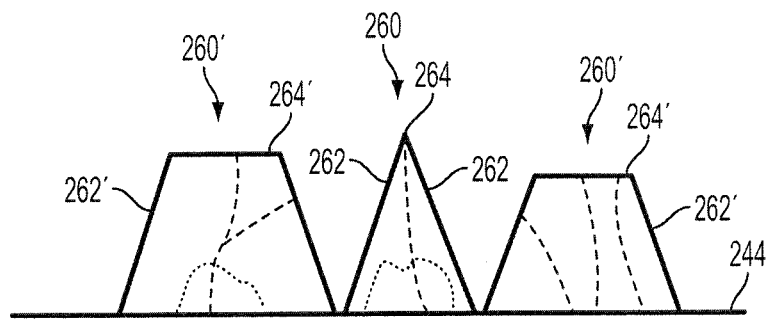

FIG. 13 schematically illustrates one peak-shaped island 260 and two mesa-shaped islands 260'. As shown in FIG. 13, the peak-shaped island has angled facets 262 that are oriented at acute angles of greater than zero degrees (e.g., between about 40 degrees and about 85 degrees) relative to the surface 244 of the substrate 240. The angled facets 262 extend to and converge at a relatively sharp point 264 at the top of the peak-shaped island 260. The mesa-shaped islands 260' have angled facets 262' similar to the angled facts 262 of the peak-shaped islands 260, but the angled facets 262' of the mesa-shaped islands 260' extend to and intersect a flat, planar surface 264' that is oriented general parallel to the flat, planar growth surface 244 of the substrate 240. During the annealing and recrystallization process used to convert the nucleation layer 250 of FIG. 6 to crystalline islands, both peak-shaped islands 260 and mesa-shaped islands 260' may be formed on the surface 244 of the substrate 240. It may be desirable to cause or encourage the formation of peak-shaped islands 260 and/or to suppress the formation of mesa-shaped islands 260', as overgrowth layers of III-nitride material formed over peak-shaped islands 260 may have relatively lower threading defect densities relative to overgrowth layers of III-nitride material formed over mesa-shaped islands 260'.

Figure 14:
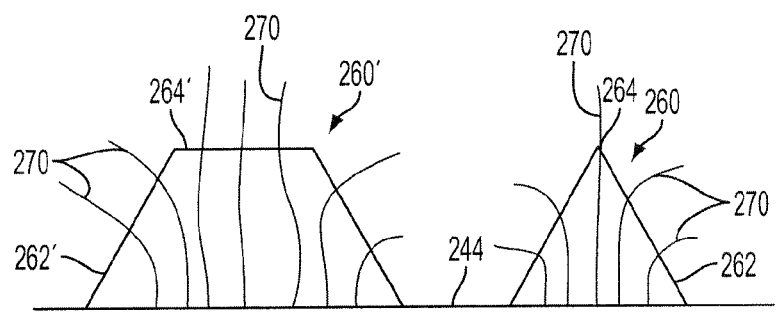
FIG. 14 is used to illustrate how threading dislocations may propagate through each of mesa-shaped islands and peak-shaped islands and into III-nitride semiconductor material deposited over the islands.

FIG. 14 is an enlarged view of a peak-shaped island 260 and a mesa-shaped island 260' like those shown in FIG. 14. Upon formation of islands by annealing and recrystallizing the nucleation layer 250 (FIG. 2), at least some of the islands will include defects in the crystal structures thereof. For example, threading dislocations 270 may extend from the interface between the surface 244 of the substrate 240 (FIG. 2) and the islands 260, 260', through an interface between the islands 260, 260' and overlying III-nitride material deposited over the islands 260, 260', and on into the overlying III-nitride material as shown in FIG. 14. As shown in FIG. 14, threading dislocations 270 that intersect the angled facets 262, 262' of the islands 260, 260' have a tendency to bend or curve toward, and extend in, a lateral direction generally parallel to the surface 244 of the substrate 240 (FIG. 2). At least some of these bent or curved threading dislocations have a tendency to recombine with one another or otherwise be annihilated, such that they do not extend in upward in the vertical direction to the exposed major surface of the overlying III-nitride material. Threading dislocations 270 that intersect the points 264 of peak-shaped islands 260 or the flat, planar surfaces of mesa-shaped islands 260', however, have a tendency to extend vertically upward to the exposed major surface of the overlying III-nitride material. Such defects are undesirable, and may detrimentally affect active devices formed using the overlying III-nitride material.

The ratio of the area of the flat, planar surface 264' of the mesa-shaped island 260' to the area of the interface between the mesa-shaped island 260' and the surface 244 of the substrate 240 (FIG. 2) may be lower than the ratio of the area of the point 264 of the peak-shaped island 260 to the area of the interface between the peak-shaped island 260 and the surface 244 of the substrate 240 (FIG. 2). Thus, a percentage of the threading dislocations 270 within the mesa-shaped island 260' that extend to the flat, planar surface 264', and, hence, to the exposed major surface of overlying III-nitride material, may be higher than a percentage of the threading dislocations 270 within the peak-shaped island 260 that extend to the point 264 and on to the exposed major surface of overlying III-nitride material. In other words, because threading dislocations 270 within the peak-shaped islands 260 are more likely to intersect the angled facets 262 than the points 264 thereof due to the minimal area of the points 264, threading dislocations 270 within peak-shaped islands 260 are less likely to propagate upward to the exposed major surface of overlying III-nitride material compared to threading dislocations 270 within mesa-shaped islands 262'.

As a result, at least in some embodiments, methods of the invention may comprise selecting and tailoring the parameters of the HVPE deposition process used to form the nucleation layer 250 of FIG. 6, and the parameters of the thermal treatment process used to anneal and recrystallize the nucleation layer 250, to preferentially form peak-shaped islands 260 as shown in FIG. 7, as opposed to mesa-shaped islands 260' like those shown in FIGS. 13 and 14.

Figure 15:
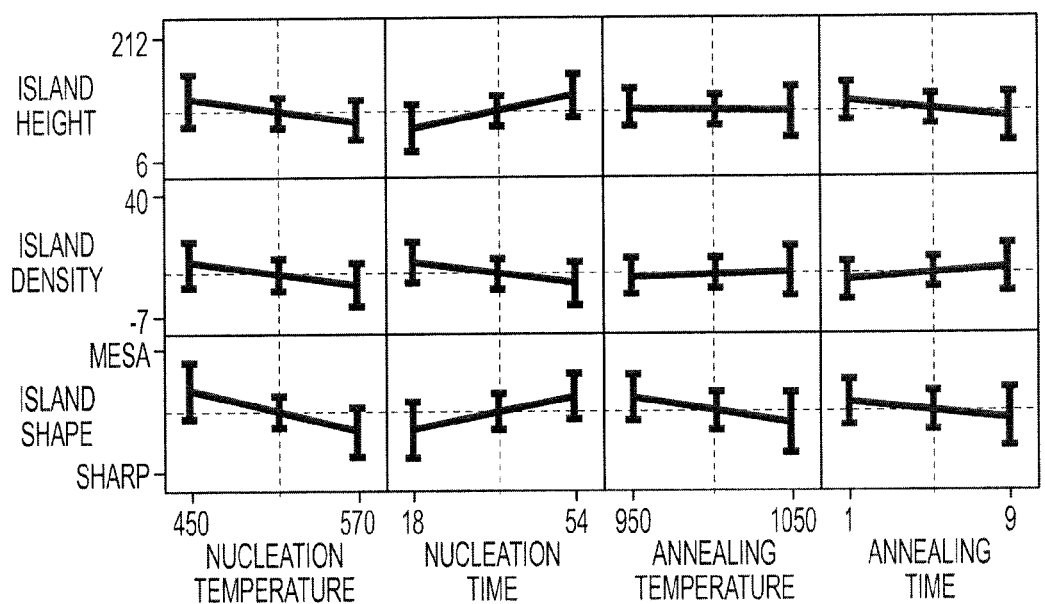
FIG. 15 is a chart illustrating how variations in certain process parameters used during formation of the islands of nucleation material of FIG. 7 from the nucleation layer of FIG. 6 affect each of the height, density, and shape of the resulting islands of nucleation material.

Applicants have investigated how certain parameters of the HVPE deposition process used to form the nucleation layer 250 of FIG. 6, and the parameters of the thermal treatment process used to anneal and recrystallize the nucleation layer 250, affect each of the height, density, and shape of the resulting islands of nucleation material. FIG. 15 is a chart illustrating the results of the investigations.

As shown in FIG. 15, it has been discovered that, during the HVPE deposition process used to form the nucleation layer 250 of FIG. 6 (which is identified in FIG. 15 as the "nucleation" process), mesa-shaped islands 260' have a tendency to form at deposition temperatures at about 450° C., while peak-shaped islands 260 have a tendency to form at deposition temperatures at about 570° C. Thus, in accordance with some embodiments of the invention, the HVPE deposition process used to form the nucleation layer 250 of FIG. 6 may be carried out at temperatures of at least about 500° C., and may be carried out at temperatures between about 500° C. and about 700° C., between about 550° C. and about 600° C., or even between about 560° C. and about 580° C. (e.g., about 570° C.). It has also been discovered that, during the HVPE deposition process used to form the nucleation layer 250 of FIG. 6, mesa-shaped islands 260' have a tendency to form at deposition (i.e., nucleation) times of about 54 sec, while peak-shaped islands 260 have a tendency to form at deposition times of about 18 sec. Thus, in accordance with some embodiments of the invention, the HVPE deposition process used to form the nucleation layer 250 of FIG. 6 may be carried out over a time period of less than about 45 sec, and may be carried out over a time period of between about 5 sec and about 45 sec, between about 10 sec and about 30 sec, or even between about 15 sec and about 25 sec (e.g., about 18 sec).

As also shown in FIG. 15, it has been discovered that, during annealing and recrystallization process used to form the islands 260 of FIG. 7 from the nucleation layer 250 of FIG. 6 (which process is identified in FIG. 15 as the "annealing" process), mesa-shaped islands 260' have a tendency to form at annealing temperatures at about 950° C., while peak-shaped islands 260 have a tendency to form at annealing temperatures at about 1050° C. Thus, in accordance with some embodiments of the invention, the annealing and recrystallization process used to form the islands 260 of FIG. 7 may be carried out at temperatures of at least about 1000° C., and may be carried out at temperatures between about 1000° C. and about 1300° C., between about 1025° C. and about 1100° C., or even between about 1040° C. and about 1070° C. (e.g., about 1050° C.). It has also been discovered that, during the annealing and recrystallization process used to form the islands 260 of FIG. 7, mesa-shaped islands 260' have a tendency to form at annealing time periods of about 1 min, while peak-shaped islands 260 have a tendency to form at annealing time periods of about 9 min. Thus, in accordance with some embodiments of the invention, the annealing and recrystallization process used to form the islands 260 of FIG. 7 may be carried out over time periods of greater than about three min, and may be carried out over time periods of between about 3 min and about 10 min, between about 5 min and about 10 min, or even between about 7 min and about 10 min (e.g., about 9 min).

The affects of each of the process parameters discussed above on the height of the resulting islands 260 and the density of the resulting islands 260 is also shown in the chart of FIG. 15. It appears from FIG. 15 that higher nucleation temperatures and lower nucleation times, which are desirable for the formation of peak-shaped islands 260, may result in the islands 260 having a lower average height and relatively higher densities, which also may be preferred for improved characteristics of the nucleation template layer ultimately formed from the islands 260, as discussed below.

Referring again to FIG. 7, threading defects 270 are illustrated in the peaked-shaped islands 260 of metal nitride nucleation material.

Figure 8:
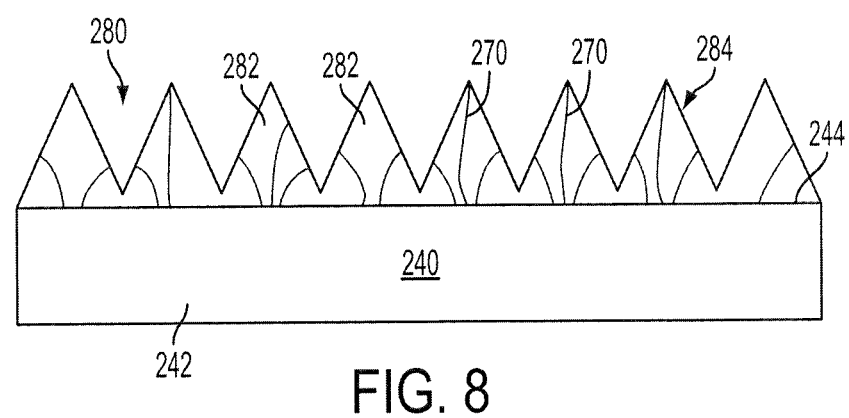
FIG. 8 is a simplified cross-sectional view illustrating growth and coalescence of the crystalline islands of nucleation material shown in FIG. 7 to form a nucleation template layer.

After forming the peaked-shaped islands 260 as described above, the peaked-shaped islands 260 may be grown and coalesced to form metal nitride nucleation template layer 280 as shown in FIG. 8. The islands 260 may be grown using an HPVE deposition process in an HPVE system 100 as described above. The islands 260 may be grown until at least the bases of the islands 260 have converged with one another, such that the metal nitride nucleation template layer 280 is at least substantially continuous. The nucleation template layer 280 may comprise peaks 282, each of which may correspond to one of the previously formed islands 260 of FIG. 7. The metal nitride nucleation template layer 280 may at least substantially cover the surface 244 of the substrate 240, such that the surface 244 is not exposed between the peaks 282 of the nucleation template layer 280. As substantially all of the islands 260 may be at least substantially epitaxially aligned with the underlying surface 244 of the substrate 240, as the islands 260 grow and converge with one another, the crystal lattices of each of the islands 260 may substantially match-up with and align with one another, such that the nucleation template layer 280 is substantially comprised of single crystal material, and such that relatively few defects are formed at the merging interface between coalescing islands 260. It is believed that relatively fewer defects are formed at the merging interface between coalescing peak-shaped islands 260 like those shown in FIG. 6 relative to the merging interface between coalescing mesa-shaped islands 260', like those shown in FIGS. 13 and 14.

In addition, in some embodiments, the metal nitride nucleation template layer 280 may be at least substantially comprised of wurtzite nucleation material.

By way of example and not limitation, the islands 260 may be grown and coalesced in an HPVE process within the reaction chamber 102 at temperatures of, for example, between about 900° C. and about 1100° C. (e.g., about 1000° C.) and at pressures between about 50 Torr and about 760 Torr (1 atmosphere) (e.g., about 200 Torr).

After growing the islands 260 to form the metal nitride nucleation template layer 280 shown in FIG. 8, the nucleation template layer 280 may be thermally treated to subject the nucleation template layer 280 to an annealing process to improve the characteristics of the crystal lattice of the nucleation template layer 280 and to reduce the number of defects in the nucleation template layer 280.

The nucleation template layer 280 may be subjected to the annealing process in the same reaction chamber 102 in which the prior processing steps discussed above have been carried out, subsequent to the formation of the nucleation template layer 280, as an integral part of an overall HVPE process used to form III-nitride semiconductor material over the substrate 240. By way of example and not limitation, the annealing process to which the nucleation template layer 280 is subjected may comprise subjecting the nucleation template layer 280 to a temperature or temperatures between about 900° C. and about 1100° C. (e.g., about 1000° C.) and pressures between about 50 Torr and about 760 Torr (1 atmosphere) (e.g., about 150 Torr), over a time period of between about five minutes (5 min) and about fifteen minutes (15 min) (e.g., about 10 min). Additionally, a Group V precursor gas such as ammonia ($NH_3$) may be caused to flow through the reaction chamber 102 during the annealing of the nucleation template layer 280 (without flowing any Group III precursor gas through the reaction chamber 102).

Applicants have investigated how certain parameters of the HVPE deposition process used to form the nucleation template layer 280 of FIG. 8 from the islands 260 of FIG. 7, and the parameters of the thermal treatment process used to anneal the nucleation template layer 280, affect each of the surface roughness of the exposed major surface 284 of the nucleation template layer 280, the number of defects in the nucleation template layer 280, and the resulting average thickness of the nucleation template layer 280. The results of these investigations are shown in the chart of FIG. 16.

Figure 16:
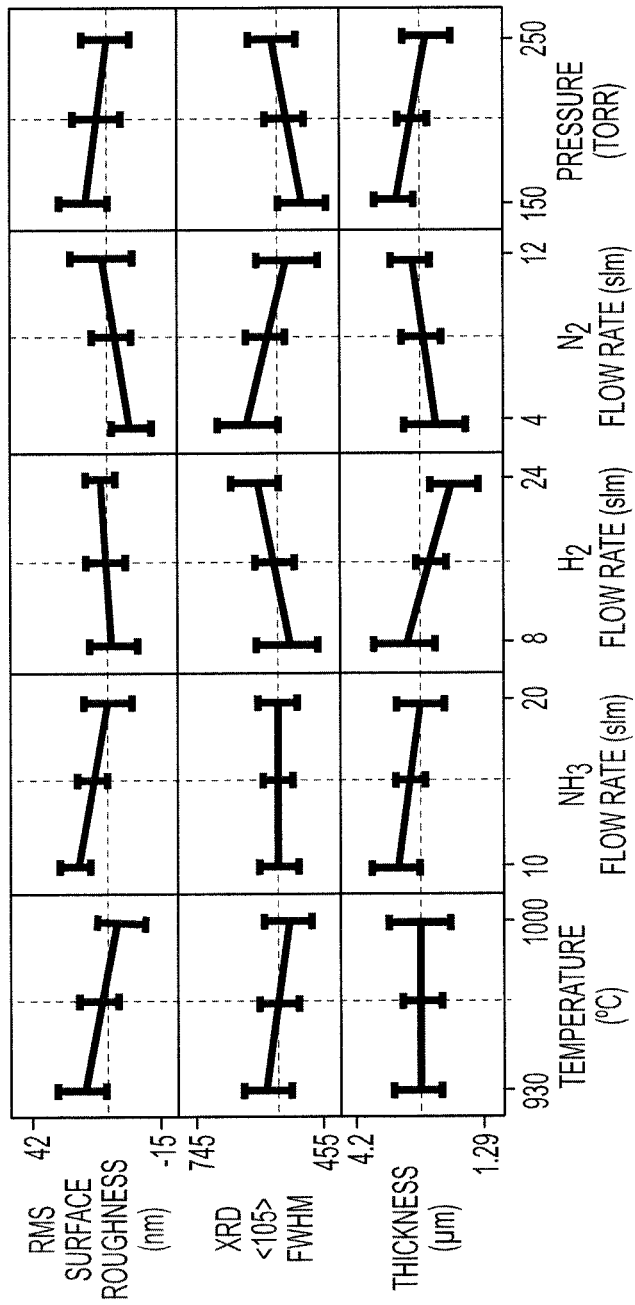
FIG. 16 is a chart illustrating how variations in certain process parameters used during formation of the nucleation template layer of FIG. 8 from the islands of nucleation material of FIG. 7 affect each of the surface roughness, crystal quality, and average thickness of the nucleation template layer.

As shown in FIG. 16, it has been discovered that relatively higher growth and annealing temperatures during the formation of the nucleation template layer 280 result in lower root mean square (RMS) surface roughness of the exposed major surface 284 of the nucleation template layer 280. Thus, in accordance with some embodiments of the invention, the HVPE deposition and annealing processes used to form the nucleation template layer 280 of FIG. 8 may be carried out at temperatures of at least about 950° C., and may be carried out at temperatures between about 950° C. and about 1100° C., between about 975° C. and about 1050° C., or even between about 985° C. and about 1015° C. (e.g., about 1000° C.). It has been discovered that relatively higher flows of Group V precursor gas (e.g., ammonia ($NH_3$)) through the reaction chamber 102 during the formation of the nucleation template layer 280 result in lower RMS surface roughness of the exposed major surface 284 of the nucleation template layer 280. Thus, in accordance with some embodiments of the invention, the HVPE deposition and annealing processes used to form the nucleation template layer 280 of FIG. 8 may be carried out while flowing Group V precursor gas (e.g., ammonia ($NH_3$)) through the reaction chamber 102 at flow rates of at least about 10 slm. For example, the flow rate of the Group V precursor gas may be between about 10 slm and about 30 slm, between about 15 slm and about 25 slm, or even between about 18 slm and about 22 slm (e.g., about 20 slm). Further, the RMS surface roughness of the exposed major surface 284 of the nucleation template layer 280 may be about 5.0 nm or less, or even below about 2.0 nm or less in accordance with some embodiments of the invention.

X-ray diffraction (XRD) was performed on the nucleation template layer 280 of various samples fabricated as described herein. In particular, the (105) reflections were measured, and the full width at half maximum (FWHM) values of the resulting peaks were measured. Lower FWHM values indicate tighter peaks, and, hence, less variation in the respective lattice parameter in the crystal lattice giving rise to the reflections, which indicates less defects in the crystal lattice. As shown in FIG. 16, it has been discovered that higher temperatures and lower pressures during the HVPE deposition and annealing processes used to form the nucleation template layer 280 of FIG. 8 may result in lower FWHM values, and, hence, improved crystallinity and/or lower defects in the crystal lattice of the nucleation template layer 280. Thus, in addition to the temperature ranges provided herein above, the HVPE deposition and annealing processes used to form the nucleation template layer 280 of FIG. 8 may be carried out at pressures of about 235 Torr or less, and may be carried out at pressures of between about 50 Torr and about 235 Torr, between about 120 Torr and about 170 Torr, or even between about 140 Torr and about 160 Torr (e.g., at about 150 Torr). With further reference to the XRD data in FIG. 16, it has been discovered that relatively lower flows of hydrogen purge gas ($H_2$) through the reaction chamber 102 during the formation of the nucleation template layer 280 result in improved crystallinity and/or lower defects in the crystal lattice of the nucleation template layer 280. Thus, in accordance with some embodiments of the invention, the HVPE deposition and annealing processes used to form the nucleation template layer 280 of FIG. 8 may be carried out while flowing hydrogen purge gas ($H_2$) through the reaction chamber 102 at flow rates of about 15 slm or less. For example, the flow rate of the hydrogen purge gas may be between about 2 slm and about 15 slm, between about 4 slm and about 12 slm, or even between about 6 slm and about 10 slm (e.g., about 8 slm).

With continued reference to FIG. 16, it has further been discovered that the relatively lower flow rates of hydrogen purge gas ($H_2$) and the relatively lower pressures mentioned above, which are believed to result in improved crystallinity and/or lower defects in the crystal lattice of the nucleation template layer 280, also result in increased average total thickness of the resulting nucleation template layer 280. This is believed to be at least partially a result of decreased etching of the nucleation template layer 280 by reduced concentration of hydrogen radicals in the reaction chamber 102, and reduced gas phase reactions occurring in the reaction chamber 102 due to the lower pressures.

Figure 17:
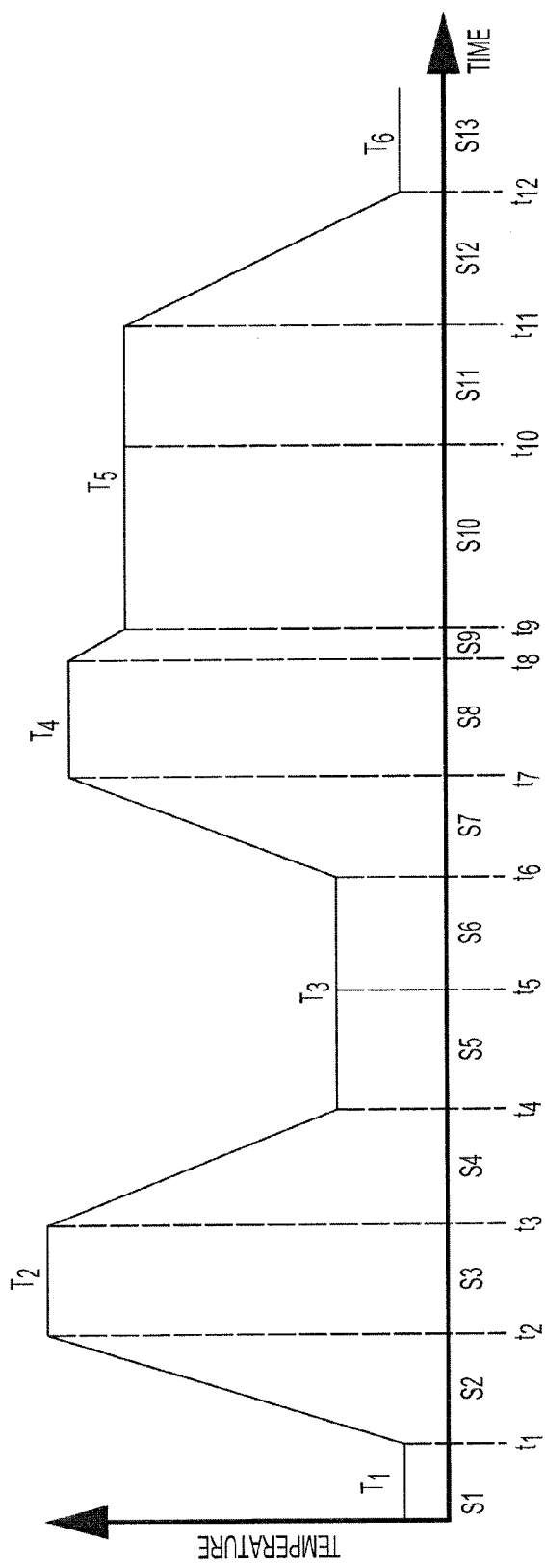
FIG. 17 is a graph schematically representing a deposition process that may be used to deposit the nucleation layer shown in FIG. 6 and to anneal the nucleation layer to form the islands of nucleation material shown in FIG. 7 using an HVPE deposition process and a system like that shown in FIGS. 1A and 1B.

FIG. 17 is a graph schematically representing a non-limiting example of an HVPE deposition process that may be used to deposit a nucleation layer 250 as shown in FIG. 6, to crystallize the nucleation layer 250 to form islands 260 of nucleation material as shown in FIG. 7, and to grow and coalesce the islands to form a crystalline nucleation template layer 280 as shown in FIG. 8, using the deposition system 100 of FIGS. 1A and 1B. The deposition process shown in FIG. 17 is provided as an example, and other HVPE deposition processes and systems also may be used to perform embodiments of methods of the invention. Referring to FIG. 17, the example deposition process is represented by plotting temperature T in the reaction chamber 102 as a function of time t. As shown in the graph, the deposition process includes thirteen (13) stages, which are sequentially labeled S1 through S13. Non-limiting example process parameters of the deposition process throughout each of the thirteen stages S1 through S13 are provided in Table 1 below.

TABLE 1

| Stage | Description | Temp. | Time Period | Pressure | Group III Source | Group V Source | Purge Gas |
|---|---|---|---|---|---|---|---|
| S1 | Stabilization | 400° C. | 30 sec | 200 Torr | — | — | $N_2$ 15 slm<br>$H_2$ 2 slm |
| S2 | Ramp | — | 4.5 min | 200 Torr | — | — | $N_2$ 5 slm<br>$H_2$ 22 slm |
| S3 | Bake | 1100° C. | 10 min | 200 Torr | — | — | $N_2$ 5 slm<br>$H_2$ 22 slm |
| S4 | Ramp | — | 4 min | 200 Torr | — | — | $N_2$ 5 slm<br>$H_2$ 22 slm |
| S5 | Stabilization | 570° C. | 3 min | 200 Torr | — | — | $N_2$ 5 slm<br>$H_2$ 18 slm |
| S6 | Nucleation | 570° C. | 60 sec | 200 Torr | $N_2$ 2.5 slm<br>$H_2$ 0.8 slm<br>$GaCl_3$ 51 sccm | $NH_3$ 2 slm | $N_2$ 6 slm<br>$H_2$ 18 slm |
| S7 | Ramp | — | 3.5 min | 200 Torr | — | $NH_3$ 6 slm | $N_2$ 2 slm<br>$H_2$ 21 slm |
| S8 | Crystallization | 1050° C. | 3.5 min | 200 Torr | — | $NH_3$ 6 slm | $N_2$ 2 slm<br>$H_2$ 21 slm |
| S9 | Ramp | — | — | 200 Torr | — | — | — |
| S10 | Coalescence | 1000° C. | 23 min | 150 Torr | $N_2$ 2.5 slm<br>$H_2$ 0.8 slm<br>$GaCl_3$ 51 sccm | $NH_3$ 20 slm | $N_2$ 12 slm<br>$H_2$ 4 slm |
| S11 | Anneal | 1000° C. | 10 min | 150 Torr | — | $NH_3$ 20 slm | $N_2$ 12 slm<br>$H_2$ 4 slm |
| S12 | Ramp | — | 4.5 min | 500 Torr | — | $NH_3$ 12 slm | $N_2$ 2 slm<br>$H_2$ 21 slm |
| S13 | Stabilization | 400° C. | 2 min | 500 Torr | — | $NH_3$ 12 slm | $N_2$ 2 slm<br>$H_2$ 21 slm |

As shown in FIG. 17 and Table 1, stage S1 is a stabilization stage during which the workpiece substrates 106 are heated to and stabilized at a temperature $T_1$ of 400° C. and a pressure of 200 Torr while flowing a purge gas through the reaction chamber 102. The purge gas comprises $N_2$ at a flow rate of 15 standard liters per minute (slm) and $H_2$ at a flow rate of 2 slm.

The ramp stage S2 commences at time $t_2$ and extends for a duration of 4.5 min. During the ramp stage S2, the reaction chamber 102 is heated steadily and continuously at a substantially constant ramp rate from temperature $T_1$ to a temperature $T_2$ of 1100° C. The pressure within the reaction chamber 102 is maintained at 200 Torr during ramp stage S2. During the ramp stage S2, a purge gas comprising $N_2$ at a flow rate of 5 slm and $H_2$ at a flow rate of 22 slm is passed through the reaction chamber 102.

The bake stage S3 commences at time at time $t_2$ and extends for a duration of 10 min. The bake stage is used to clean and repair the upper growth surface of the growth substrates prior to deposition thereon. During the bake stage S3, the reaction chamber 102 is maintained at the temperature $T_2$ of 1100° C. and the pressure of 200 Torr. During the bake stage S3, a purge gas comprising $N_2$ at a flow rate of 5 slm and $H_2$ at a flow rate of 22 slm is passed through the reaction chamber 102.

The ramp stage S4 commences at time $t_3$ and extends for a duration of 4 min. During the ramp stage S4, the reaction chamber 102 is cooled steadily and continuously at a substantially constant ramp rate from temperature $T_2$ to a temperature $T_3$ of 570° C. The pressure within the reaction chamber 102 is maintained at 200 Torr during ramp stage S4. During the ramp stage S4, a purge gas comprising $N_2$ at a flow rate of 5 slm and $H_2$ at a flow rate of 22 slm is passed through the reaction chamber 102.

Stabilization stage S5 commences at time $t_4$ and extends for a duration of 3 min. The temperature in the reaction chamber is maintained at 570° C., the pressure in the reaction chamber 102 is maintained at 200 Torr, and purge gas comprising $N_2$ at a flow rate of 5 slm and $H_2$ at a flow rate of 18 slm is flown through the reaction chamber 102 during the stabilization stage S5.

Nucleation stage S6 commences at time $t_5$ and extends for a duration of 60 sec. The nucleation stage S6 is used to deposit the nucleation layer 250 on the growth substrate 240, as previously described with reference to FIGS. 5 and 6. During the nucleation stage S6, the temperature in the reaction chamber 102 is maintained at 570° C., and the pressure in the reaction chamber 102 is maintained at 200 Torr. Purge gas comprising $N_2$ at a flow rate of 6 slm and $H_2$ at a flow rate of 18 slm is flown through the reaction chamber 102 during the nucleation stage S6. Group V source gas comprising $NH_3$ is flown through the reaction chamber 102 at a flow rate of 2 slm, and Group III precursor gas comprising $GaCl_3$ is flown into the reaction chamber at a flow rate of 51 standard cubic centimeters per minute (sccm).

Ramp stage S7 commences at time $t_6$ and extends for a duration of 4 min. During the ramp stage S7, the reaction chamber 102 is heated steadily and continuously at a substantially constant ramp rate from temperature $T_3$ to a temperature $T_4$ of 1050° C. The pressure within the reaction chamber 102 is maintained at 200 Torr during ramp stage S7. During the ramp stage S7, a purge gas comprising $N_2$ at a flow rate of 2 slm and $H_2$ at a flow rate of 21 slm is passed through the reaction chamber 102. Group V source gas comprising $NH_3$ is flown through the reaction chamber 102 at a flow rate of 6 slm during ramp stage S7.

Crystallization stage S8 commences at time $t_7$ and extends for a duration of 3.5 min. The crystallization stage S8 is used to anneal and crystallize the nucleation layer 250 on the growth substrate 240 and form the islands 260 of nucleation material, as previously described with reference to FIGS. 6 and 7. During the crystallization stage S8, the temperature in the reaction chamber 102 is maintained at 1050° C., and the pressure in the reaction chamber 102 is maintained at 200 Torr. Purge gas comprising $N_2$ at a flow rate of 2 slm and $H_2$ at a flow rate of 21 slm is flown through the reaction chamber 102 during the nucleation stage S6. Group V source gas comprising NH$_3$ is flown through the reaction chamber 102 at a flow rate of 6 slm during the crystallization stage S8.

Ramp stage S9 commences at time t$_8$ and extends for a duration of 20 sec. During the ramp stage S9, the reaction chamber 102 is cooled steadily and continuously at a substantially constant ramp rate from temperature T$_4$ to a temperature T$_5$ of 1000° C. The pressure within the reaction chamber 102 is reduced from 200 Torr to 150 Torr during ramp stage S9. During the ramp stage S9, a purge gas comprising N$_2$ at a flow rate of 2 slm and H$_2$ at a flow rate of 21 slm is passed through the reaction chamber 102. Group V source gas comprising NH$_3$ is flown through the reaction chamber 102 at a flow rate of 6 slm during ramp stage S7.

Coalescence stage S10 commences at time t$_9$ and extends for a duration of 10 min. The coalescence stage S10 is used to grow and coalesce the islands 260 of nucleation material to form the nucleation template layer 280, as previously described with reference to FIGS. 7 and 8. During the coalescence stage S10, the temperature in the reaction chamber 102 is maintained at 1000° C., and the pressure in the reaction chamber 102 is maintained at 150 Torr. Purge gas comprising N$_2$ at a flow rate of 12 slm and H$_2$ at a flow rate of 4 slm is flown through the reaction chamber 102 during the annealing stage S10. Group V source gas comprising NH$_3$ is flown through the reaction chamber 102 at a flow rate of 20 slm, and Group III precursor gas comprising GaCl$_3$ is flown into the reaction chamber at a flow rate of 51 standard cubic centimeters per minute (sccm).

Annealing stage S11 commences at time t$_{10}$ and extends for a duration of 10 min. The annealing stage S11 is used to anneal the nucleation template layer 280, as previously described with reference to FIG. 8. During the annealing stage S11, the temperature in the reaction chamber 102 is maintained at 1000° C., and the pressure in the reaction chamber 102 is maintained at 150 Torr. Purge gas comprising N$_2$ at a flow rate of 12 slm and H$_2$ at a flow rate of 4 slm is flown through the reaction chamber 102 during the annealing stage S11. Group V source gas comprising NH$_3$ is flown through the reaction chamber 102 at a flow rate of 20 slm during the annealing stage S11.

The ramp stage S12 commences at time t$_{ii}$ and extends for a duration of 4.5 min. During the ramp stage S12, the reaction chamber 102 is cooled steadily and continuously at a substantially constant ramp rate from temperature T$_5$ to a temperature T$_6$ of 400° C. The pressure within the reaction chamber 102 is maintained at 500 Torr during ramp stage S12. During the ramp stage S12, a purge gas comprising N$_2$ at a flow rate of 2 slm and H$_2$ at a flow rate of 21 slm is passed through the reaction chamber 102. Group V source gas comprising NH$_3$ is flown through the reaction chamber 102 at a flow rate of 12 slm during the ramp stage S12.

Stabilization stage S13 commences at time t$_{12}$ and extends for a duration of 2 min. The temperature in the reaction chamber is maintained at 400° C., the pressure in the reaction chamber 102 is maintained at 500 Torr, and purge gas comprising N$_2$ at a flow rate of 2 slm and H$_2$ at a flow rate of 21 slm is flown through the reaction chamber 102 during the stabilization stage S5. Group V source gas comprising NH$_3$ is flown through the reaction chamber 102 at a flow rate of 12 slm during the stabilization stage S13.

Referring again to FIG. 8, the nucleation template layer 280 is employed to enable the deposition of bulk III-nitride semiconductor material over the substrate 240 to a desirable average total thickness while maintaining defect densities in the deposited bulk III-nitride semiconductor material at desirable concentrations. Due to differences between the crystal lattice structures of the material 242 of the substrate 240 and the bulk III-nitride semiconductor material that is to be deposited over the substrate 240 (which differences are often referred to in the art as "crystal lattice mismatch"), the crystal structure of the bulk III-nitride semiconductor material might contain relatively higher, undesirable concentrations of defects such as dislocations if the bulk III-nitride semiconductor material were to be directly deposited onto the exposed major surface 244 of the substrate 240. Thus, a nucleation template layer 280 is provided between the substrate 240 and the bulk III-nitride semiconductor material in an effort to curb the effects of the crystal lattice mismatch between the substrate 240 and the overlying bulk III-nitride semiconductor material. In other words, the nucleation template layer 280 may be used to buffer the crystal lattice mismatch between the substrate 240 and the bulk III-nitride semiconductor material to be deposited thereover, and such nucleation template layers 280 are also referred to in the art as "buffer" layers. Further, the nucleation template layer 280 may be used as a seed layer to nucleate growth of the bulk III-nitride semiconductor material thereon, and such nucleation template layers 280 are also referred to in the art as "seed" layers.

After depositing a nucleation layer 250, crystallizing the nucleation layer 250 to form islands 260 of nucleation material, and growing and coalescing the islands 260 to form a crystalline nucleation template layer 280, as previously described herein with reference to FIGS. 5 through 8, one or more overgrowth layers of III-nitride semiconductor material may be grown over the crystalline nucleation template layer 280 as described below with reference to FIGS. 9 and 10.

Figure 9:
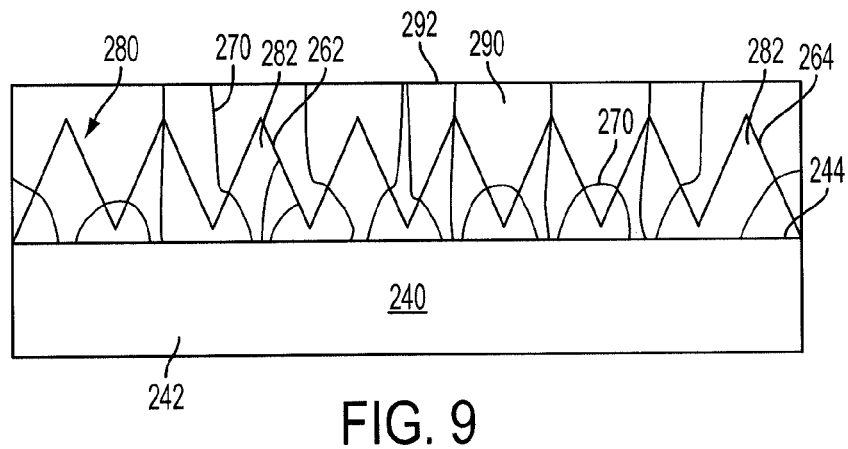
FIG. 9 illustrates a lateral overgrowth layer of III-nitride semiconductor material formed by causing preferential lateral growth of the III-nitride semiconductor material from angled side facets of the islands of nucleation material shown in FIG. 8.

Referring to FIG. 9, after forming the nucleation template layer 280, a first overgrowth layer of III-nitride semiconductor material 290 may be nucleated and deposited onto and over exposed major surface 284 of the nucleation template layer 280 using an HVPE process. Although a discrete boundary is visible between the nucleation template layer 280 and the first overgrowth layer of III-nitride semiconductor material 290 in the simplified drawing of FIG. 9, it is noted that the nucleation template layer 280 and the overgrowth layer of III-nitride semiconductor material 290 may, in some embodiments, have at least substantially the same composition, and it may be difficult or impossible to visualize or otherwise identify any discrete boundary between the nucleation template layer 280 and the overgrowth layer of III-nitride semiconductor material 290.

The first overgrowth layer of III-nitride semiconductor material 290 may comprise a lateral growth layer. In other words, the HVPE deposition process used to grow the layer of III-nitride semiconductor material 290 may be tailored to cause growth in lateral directions (i.e., parallel to the growth surface 244 of the substrate 240) faster than growth in the vertical direction (i.e., perpendicular to the growth surface 244 of the substrate 240). Such lateral growth may be established by selecting the growth conditions to favor addition of material to the angled facets 262 of the peaks 282 that are oriented at acute angles to the upper surface 244 of the growth substrate 240 as opposed to any surfaces oriented parallel to the upper surface 244. The lateral growth of the overgrowth layer of the III-nitride semiconductor material 290 may proceed from the angled facets 262 of the peaks 282 of the nucleation template layer 280 until the growing III-nitride semiconductor material coalesces to form the first overgrowth layer of III-nitride semiconductor material 290 shown in FIG. 9. As shown in FIG. 9, the first overgrowth layer of III-nitride semiconductor material 290 may have a substantially planar upper surface 292.

Generally, the relative rates of lateral growth and vertical growth of the III-nitride material may be influenced by growth temperature, the ratio of Group V precursor to Group III precursor in the process gases, the composition of the carrier gas species, and the pressure within the reaction chamber. For example, lateral growth may be enhanced by at least one of increased deposition temperatures, increased ratio of Group V to Group III precursors, a greater $N_2$ to $H_2$ ratio, and reduced deposition pressures of, for example, about 760 Torr (1 atmosphere) or less.

The lateral growth of the III-nitride material from the angled facets 262 may cause threading dislocation 270 within the DI-nitride material that originated in the nucleation template layer 280 to bend or curve in the lateral direction. As previously mentioned herein, when one or more threading dislocations 270 meet one another as the III-nitride material coalesces between the peaks 282 of the nucleation template layer 280, those threading dislocations 270 may combine and annihilate one another, resulting in a reduction in the concentration of threading dislocations 270 within the first overgrowth layer of III-nitride semiconductor material 290. Some threading dislocations 270 are illustrated in FIG. 9 that have combined and annihilated one another, such that they do not propagate to the exposed major surface 292 of the first overgrowth layer of III-nitride semiconductor material 290. Thus, in accordance with some embodiments of the invention, the threading dislocation density at the exposed major surface 292 of the first overgrowth layer of III-nitride semiconductor material 290 may be less than about $5 \times 10^9$ cm$^{-2}$, less than about $5 \times 10^8$ cm$^{-2}$, or even less than about $1 \times 10^7$ cm$^{-2}$.

Figure 10:
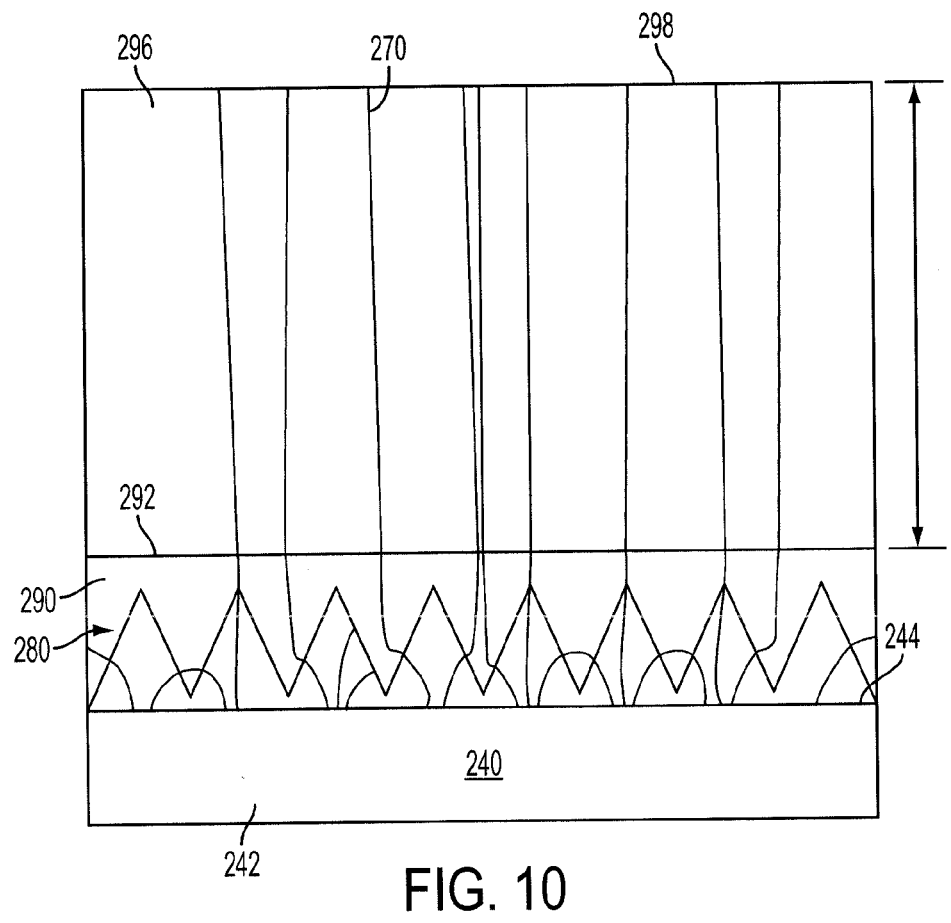
FIG. 10 illustrates another overgrowth layer of III-nitride semiconductor material formed by vertical growth of the III-nitride semiconductor material over the lateral overgrowth layer of III-nitride semiconductor material shown in FIG. 9.

Referring to FIG. 10, after forming the first overgrowth layer of III-nitride semiconductor material 290 (as shown in FIG. 9), the HVPE growth conditions in the reaction chamber 102 may be altered to favor growth in the vertical direction, and a second overgrowth layer of bulk III-nitride semiconductor material 296 may be grown over the first overgrowth layer of III-nitride semiconductor material 290. Although a discrete boundary is visible between the first overgrowth layer of III-nitride semiconductor material 290 and the second overgrowth layer of bulk III-nitride semiconductor material 296 in the simplified drawing of FIG. 10, it is noted that these material layers may, in some embodiments, have at least substantially the same composition, and it may be difficult or impossible to visualize or otherwise identify any discrete boundary therebetween. As shown in FIG. 10, threading dislocations at the surface 292 of the first overgrowth layer of III-nitride semiconductor material 290 may propagate in the vertical direction to the exposed major surface 298 of the second overgrowth layer of bulk III-nitride semiconductor material 296.

By way of example and not limitation, the second overgrowth layer of bulk III-nitride semiconductor material 296 may be deposited to an average total thickness $T_2$ of at least about five microns (5 μm), at least about seven microns (7 μm), at least about ten microns (10 μm), at least about twenty microns (20 μm), or even at least about thirty microns (30 μm). The presence of the nucleation template layer 280 and the first overgrowth layer of III-nitride semiconductor material 290 fabricated in accordance with embodiments of the present invention may enable the second overgrowth layer of bulk III-nitride semiconductor material 296 to be deposited to such average total thicknesses $T_2$ while maintaining dislocation densities in the second overgrowth layer of bulk III-nitride semiconductor material 296 at the exposed major surface 298 thereof below about $5 \times 10^9$ cm$^{-2}$, below about $5 \times 10^8$ cm$^{-2}$, or even below about $1 \times 10^7$ cm$^{-2}$. Further, embodiments of methods of the invention may enable the second overgrowth layer of bulk III-nitride semiconductor material 296 to be fabricated as described herein substantially free of structural cracks and without delaminated regions in the second overgrowth layer of bulk III-nitride semiconductor material 296.

As described herein, at least some embodiments of the invention may enable the fabrication of III-nitride semiconductor materials (e.g., GaN) directly on non-native substrates, such as sapphire, to higher thicknesses and with lower defect densities relative to previously known methods.

Additional non-limiting example embodiments of the invention are described below.

Embodiment 1: A method of depositing III-nitride semiconductor material on a substrate using at least one of a metal trichloride precursor and a metal tetrachloride precursor, comprising: depositing a layer of III-nitride semiconductor material on a surface of a substrate in a nucleation HVPE process stage to form a nucleation layer having a nanostructure comprising at least some wurtzite crystallites and some amorphous III-nitride semiconductor material; annealing the nucleation layer to form crystalline islands of at least substantially wurtzite nucleation material on the surface of the substrate; growing and coalescing the islands of at least substantially wurtzite nucleation material in a coalescence HVPE process stage to form a nucleation template layer of the at least substantially wurtzite nucleation material at least substantially covering the surface of the substrate; and depositing additional III-nitride semiconductor material over the nucleation template layer of the at least substantially wurtzite nucleation material in an additional HVPE process stage.

Embodiment 2: The method of embodiment 1, further comprising forming the crystalline islands of epitaxial nucleation material on the surface of the substrate to have a peak shape.

Embodiment 3: The method of embodiment 1 or embodiment 2, wherein annealing the nucleation layer to form crystalline islands of epitaxial nucleation material on the surface of the substrate comprises annealing the nucleation layer at a temperature between about 900° C. and about 1300° C.

Embodiment 4: The method of embodiment 3, wherein annealing the nucleation layer at a temperature between about 900° C. and about 1300° C. comprises annealing the nucleation layer at a temperature between about 1025° C. and about 1100° C.

Embodiment 5: The method of embodiment 4, wherein annealing the nucleation layer at a temperature between about 1025° C. and about 1100° C. comprises annealing the nucleation layer at a temperature between about 1040° C. and about 1070° C.

Embodiment 6: The method of embodiment 5, wherein annealing the nucleation layer at a temperature between about 1040° C. and about 1070° C. comprises annealing the nucleation layer at a temperature of about 1050° C.

Embodiment 7: The method of any one of embodiments 1 through 6, wherein annealing the nucleation layer to form crystalline islands of epitaxial nucleation material on the surface of the substrate comprises annealing the nucleation layer at a pressure between about 50 Torr and about 760 Torr (1 atmosphere).

Embodiment 8: The method of embodiment 7, wherein annealing the nucleation layer at a pressure between about 50 Torr and about 760 Torr (1 atmosphere) comprises annealing the nucleation layer at a pressure of about 200 Torr.

Embodiment 9: The method of any one of embodiments 1 through 7, further comprising depositing the layer of III-nitride semiconductor material on the surface of the substrate in the nucleation HVPE process stage at a temperature between about 400° C. and about 700° C.

Embodiment 10: The method of embodiment 9, wherein depositing the layer of III-nitride semiconductor material on the surface of the substrate in the nucleation HVPE process stage at a temperature between about 400° C. and about 700° C. comprises depositing the layer of III-nitride semiconductor material on the surface of the substrate in the nucleation HVPE process stage at a temperature of about 570° C.

Embodiment 11: The method of any one of embodiments 1 through 10, further comprising depositing the layer of III-nitride semiconductor material on the surface of the substrate in the nucleation HVPE process stage at a pressure between about 50 Torr and about 760 Torr (1 atmosphere).

Embodiment 12: The method of embodiment 11, wherein depositing the layer of III-nitride semiconductor material on the surface of the substrate in the nucleation HVPE process stage at a pressure between about 50 Torr and about 760 Torr (1 atmosphere) comprises depositing the layer of III-nitride semiconductor material on the surface of the substrate in the nucleation HVPE process stage at a pressure of about 200 Torr.

Embodiment 13: The method of any one of embodiments 1 through 12, further comprising growing and coalescing the islands of epitaxial nucleation material in the coalescence HVPE process stage at a temperature between about 900° C. and about 1100° C.

Embodiment 14: The method of embodiment 13, further comprising growing and coalescing the islands of epitaxial nucleation material in the coalescence HVPE process stage at a temperature between about 975° C. and about 1050° C.

Embodiment 15: The method of embodiment 14, further comprising growing and coalescing the islands of epitaxial nucleation material in the coalescence HVPE process stage at a temperature between about 985° C. and about 1015° C.

Embodiment 16: The method of any one of embodiments 1 through 15, further comprising growing and coalescing the islands of epitaxial nucleation material in the coalescence HVPE process stage at a pressure between about 100 Torr and about 760 Torr (1 atmosphere).

Embodiment 17: The method of embodiment 16, further comprising growing and coalescing the islands of epitaxial nucleation material in the coalescence HVPE process stage at a pressure of about 200 Torr.

Embodiment 18: The method of any one of embodiments 1 through 17, further comprising annealing the nucleation template layer of the epitaxial nucleation material after growing and coalescing the islands of epitaxial nucleation material.

Embodiment 19: The method of any one of embodiments 1 through 18, further comprising selecting the III-nitride semiconductor material to comprise gallium nitride.

Embodiment 20: The method of any one of embodiments 1 through 19, further comprising selecting the substrate to comprise sapphire.

Embodiment 21: A structure comprising a nucleation template layer of III-nitride nucleation material formed in accordance with a method as recited in any one of embodiments 1 through 20.

Embodiment 22: The structure of embodiment 21, further comprising bulk III-nitride semiconductor material over the nucleation template layer of III-nitride semiconductor material.

Embodiment 23: The structure of embodiment 22, wherein the bulk III-nitride semiconductor material is at least substantially free of structural cracks.

Embodiment 24: The structure of embodiment 22 or embodiment 23, wherein the bulk III-nitride semiconductor material is at least substantially free of delaminated regions.

Embodiment 25: An intermediate structure formed by a method as recited in any one of embodiments 1 through 20.

The invention claimed is:
1. A method of depositing III-nitride semiconductor material on a substrate using at least one of a metal trichloride precursor and a metal tetrachloride precursor, comprising:
depositing a layer of III-nitride semiconductor material on a surface of a substrate in a nucleation HVPE process stage to form a nucleation layer having a nanostructure comprising at least some wurtzite crystallites and some amorphous III-nitride semiconductor material;
annealing the nucleation layer to form crystalline islands of at least substantially wurtzite nucleation material on the surface of the substrate;
growing and coalescing the islands of at least substantially wurtzite nucleation material in a coalescence HVPE process stage to form a nucleation template layer of the at least substantially wurtzite nucleation material at least substantially covering the surface of the substrate;
depositing additional III-nitride semiconductor material over the nucleation template layer of the at least substantially wurtzite nucleation material in an additional HVPE process stage; and
selecting and tailoring the parameters of the nucleation HVPE process stage and the parameters of the annealing of the nucleation layer so as to preferentially form the crystalline islands to have a peak shape as opposed to a mesa shape.

2. The method of claim 1, wherein annealing the nucleation layer to form crystalline islands of epitaxial nucleation material on the surface of the substrate comprises annealing the nucleation layer at a temperature between about 900° C. and about 1300° C.

3. The method of claim 2, wherein annealing the nucleation layer at a temperature between about 900° C. and about 1300° C. comprises annealing the nucleation layer at a temperature between about 1040° C. and about 1070° C.

4. The method of claim 1, wherein annealing the nucleation layer to form crystalline islands of epitaxial nucleation material on the surface of the substrate comprises annealing the nucleation layer at a pressure of about 200 Torr.

5. The method of claim 1, further comprising depositing the layer of III-nitride semiconductor material on the surface of the substrate in the nucleation HVPE process stage at a temperature between about 400° C. and about 700° C.

6. The method of claim 1, further comprising depositing the layer of III-nitride semiconductor material on the surface of the substrate in the nucleation HVPE process stage at a pressure of about 200 Torr.

7. The method of claim 1, further comprising growing and coalescing the islands of epitaxial nucleation material in the coalescence HVPE process stage at a temperature between about 900° C. and about 1100° C.

8. The method of claim 7, further comprising growing and coalescing the islands of epitaxial nucleation material in the coalescence HVPE process stage at a temperature between about 975° C. and about 1050° C.

9. The method of claim 8, further comprising growing and coalescing the islands of epitaxial nucleation material in the coalescence HVPE process stage at a temperature between about 985° C. and about 1015° C.

10. The method of claims 1, further comprising growing and coalescing the islands of epitaxial nucleation material in the coalescence HVPE process stage at a pressure between about 100 Torr and about 760 Torr (1 atmosphere).

11. The method of claim 10, further comprising growing and coalescing the islands of epitaxial nucleation material in the coalescence HVPE process stage at a pressure of about 200 Torr.

12. The method of claim 1, further comprising annealing the nucleation template layer of the epitaxial nucleation material after growing and coalescing the islands of epitaxial nucleation material.

13. The method of claim 1, further comprising selecting the III-nitride semiconductor material to comprise gallium nitride.

14. The method of claim 1, further comprising selecting the substrate to comprise sapphire.

15. A structure comprising a nucleation template layer of III-nitride nucleation material, the nucleation template layer of III-nitride nucleation material formed by a method comprising:
  depositing a layer of III-nitride semiconductor material on a surface of a substrate in a nucleation HVPE process stage to form a nucleation layer having a nanostructure comprising at least some wurtzite crystallites and some amorphous III-nitride semiconductor material;
  annealing the nucleation layer to form crystalline islands of at least substantially wurtzite nucleation material on the surface of the substrate;
  growing and coalescing the islands of at least substantially wurtzite nucleation material in a coalescence HVPE process stage to form the nucleation template layer of III-nitride nucleation material, the nucleation template layer of III-nitride nucleation material comprising the at least substantially wurtzite nucleation material and at least substantially covering the surface of the substrate; and
  selecting and tailoring parameters of the nucleation HVPE process stage and parameters of the annealing of the nucleation layer so as to preferentially form the crystalline islands to have a peak shape as opposed to a mesa shape.

16. The structure of claim 15, further comprising bulk III-nitride semiconductor material over the nucleation template layer of III-nitride semiconductor material.

17. The structure of claim 16, wherein the bulk III-nitride semiconductor material is at least substantially free of structural cracks.

18. The structure of claim 16, wherein the bulk III-nitride semiconductor material is at least substantially free of delaminated regions.

* * * * *

UNITED STATES PATENT AND TRADEMARK OFFICE
CERTIFICATE OF CORRECTION

PATENT NO. : 9,076,666 B2
APPLICATION NO. : 13/989004
DATED : July 7, 2015
INVENTOR(S) : Arena et al.

It is certified that error appears in the above-identified patent and that said Letters Patent is hereby corrected as shown below:

On the title page:
In ITEM (57) ABSTRACT:
LINES 2-3, change "semi-conductor material" to --semiconductor material--

In the specification:
COLUMN 2, LINE 22, change "and methods." to --and methods, the entire disclosure of which patent is incorporated herein by reference.--
COLUMN 5, LINE 56, change "name of Bertran." to --name of Bertran, the disclosure of each of which is incorporated herein in its entirety by this reference.--
COLUMN 8, LINE 41, change "et al." to --et al., the entire disclosure of which is incorporated herein by reference.--
COLUMN 9, LINE 6, change "Arena et al." to --Arena et al., the disclosure of each of which is incorporated herein in its entirety by this reference.--
COLUMN 13, LINE 59, change "that the directions" to --that the [0001] directions--
COLUMN 14, LINE 56, change "that the directions" to --that the [0001] directions--
COLUMN 25, LINE 13, change "the DI-nitride" to --the III-nitride--

Signed and Sealed this
Tenth Day of May, 2016

Michelle K. Lee
*Director of the United States Patent and Trademark Office*